(12) United States Patent
Yamamoto et al.

(10) Patent No.: US 8,427,206 B2
(45) Date of Patent: Apr. 23, 2013

(54) BUFFER AND DISPLAY DEVICE

(75) Inventors: Etsuo Yamamoto, Osaka (JP);
Yuhichiroh Murakami, Osaka (JP);
Yasushi Sasaki, Osaka (JP); Seijirou Gyouten, Osaka (JP); Shinsaku Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 376 days.

(21) Appl. No.: 12/734,691

(22) PCT Filed: Aug. 19, 2008

(86) PCT No.: PCT/JP2008/064754
§ 371 (c)(1),
(2), (4) Date: May 18, 2010

(87) PCT Pub. No.: WO2009/081619
PCT Pub. Date: Jul. 2, 2009

(65) Prior Publication Data
US 2010/0253393 A1 Oct. 7, 2010

(30) Foreign Application Priority Data
Dec. 20, 2007 (JP) .................. 2007-328945

(51) Int. Cl.
*H03K 3/00* (2006.01)
(52) U.S. Cl.
USPC ............... 327/108; 327/112; 345/100
(58) Field of Classification Search .......... 327/108–112; 326/21–24, 26–27, 30, 82–83, 87; 345/87, 345/100, 104
See application file for complete search history.

(56) References Cited

U.S. PATENT DOCUMENTS

| 3,845,324 | A | 10/1974 | Feucht |
| 7,057,598 | B2 * | 6/2006 | Azami et al. .................. 345/100 |
| 2002/0167026 | A1 | 11/2002 | Azami et al. |
| 2004/0164978 | A1 | 8/2004 | Shin et al. |
| 2004/0257111 | A1 | 12/2004 | Tobita |
| 2006/0202940 | A1 | 9/2006 | Azami et al. |

FOREIGN PATENT DOCUMENTS
EP 1 253 718 10/2002
(Continued)

OTHER PUBLICATIONS
International Search Report.
(Continued)

*Primary Examiner* — Kenneth B. Wells
(74) *Attorney, Agent, or Firm* — Harness, Dickey & Pierce

(57) ABSTRACT

A single-phase input including transistors all of which have only a single type of channel polarity, which buffer includes: a buffer section 32, including a first series circuit formed by two n-channel transistors connected to each other in series, a second series circuit formed by two n-channel transistors connected to each other in series at a connection point OUT, and a capacitor; and an inverted-signal generating section for generating an inverted-signal from an input signal, the inverted-signal generating section including n-channel transistors but no p-channel transistor, the input signal being inputted to respective gates of the transistors, the inverted-signal being inputted to a gate of the transistor 4, and an output signal being outputted via the connection point OUT. With the buffer, it is possible that a consumption current be reduced and a current drive for a load is enhanced.

16 Claims, 29 Drawing Sheets

| | FOREIGN PATENT DOCUMENTS | |
|---|---|---|
| FR | 2 211 820 | 7/1974 |
| JP | 55-156427 | 12/1980 |
| JP | 2002-335153 A | 11/2002 |
| JP | 2003-179476 A | 6/2003 |
| JP | 2004-260788 A | 9/2004 |
| JP | 2005-12356 A | 1/2005 |

OTHER PUBLICATIONS

International Search Report, Sep. 22, 2008.
European Search report for corresponding European patent application No. 08792537.6 dated May 23, 2011.

* cited by examiner

F I G. 1
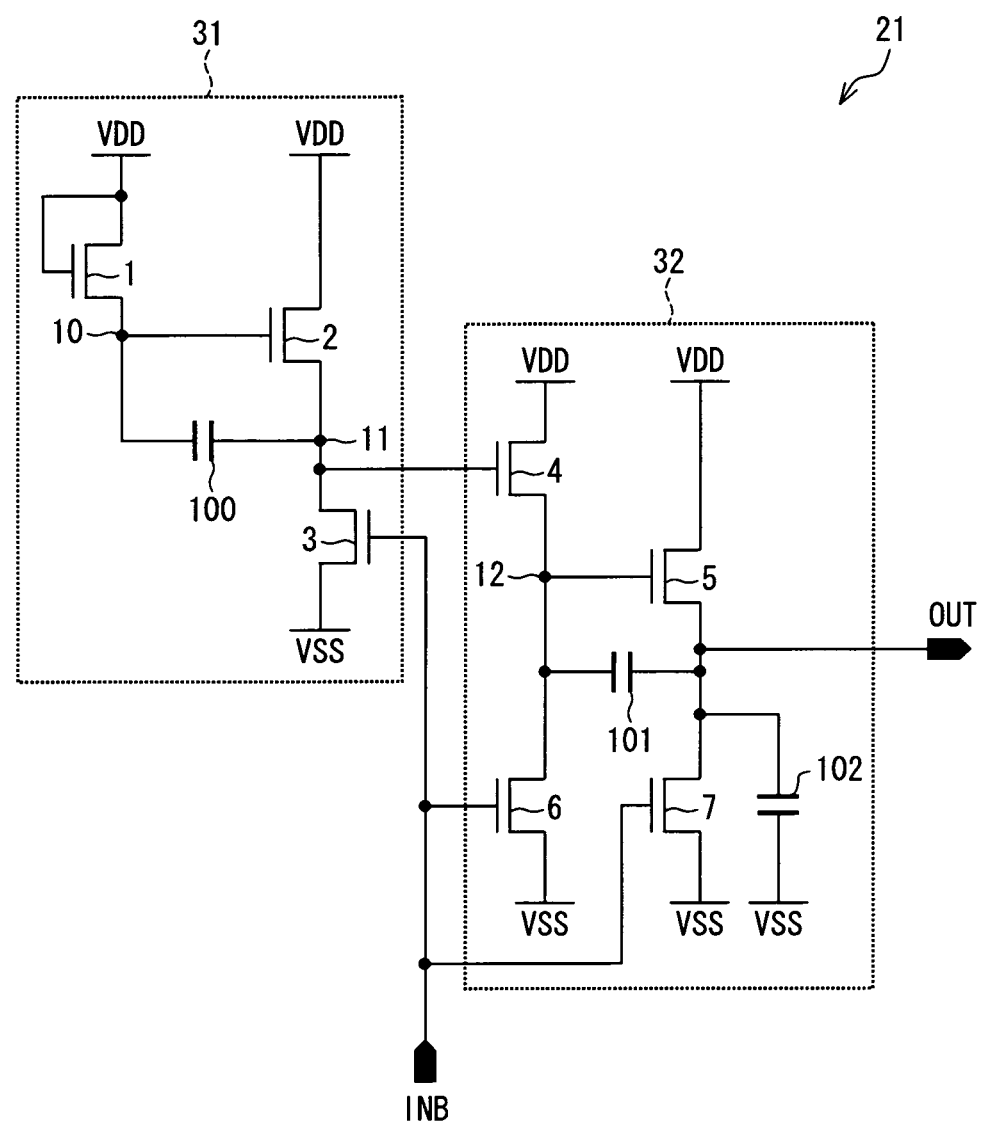

F I G. 2
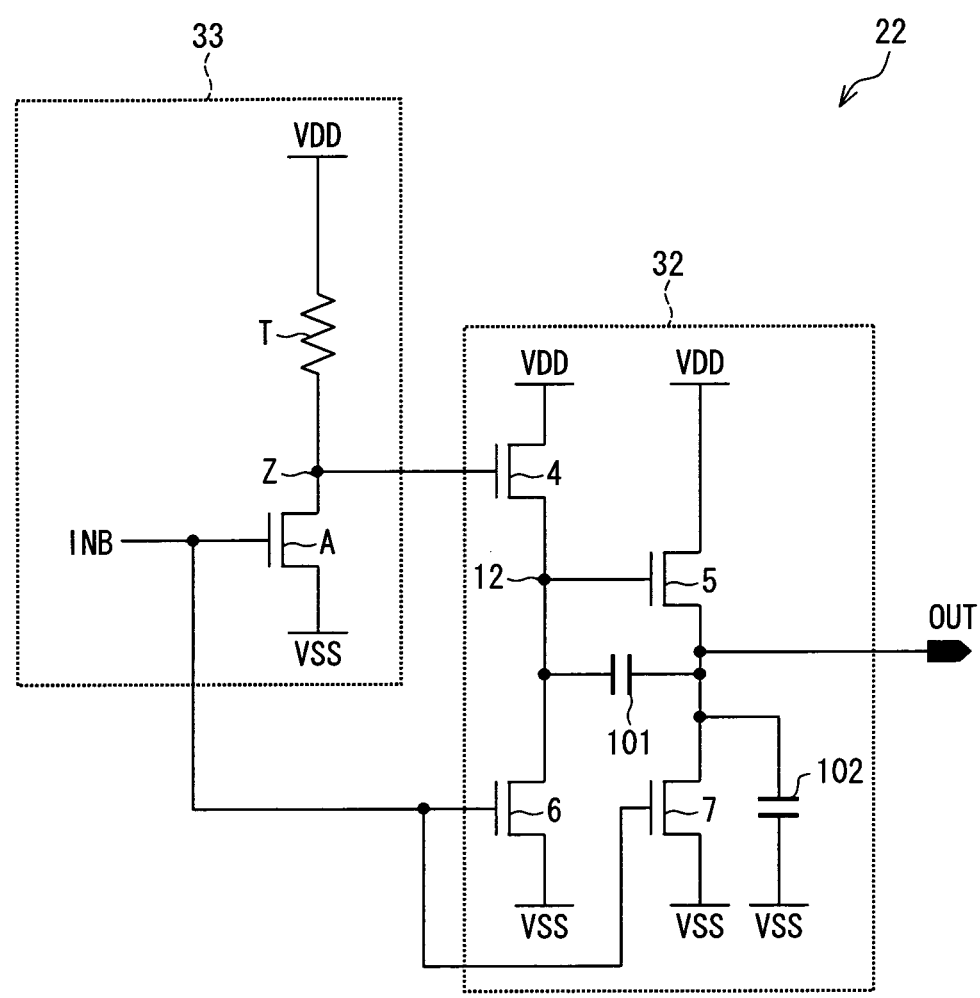

F I G. 6
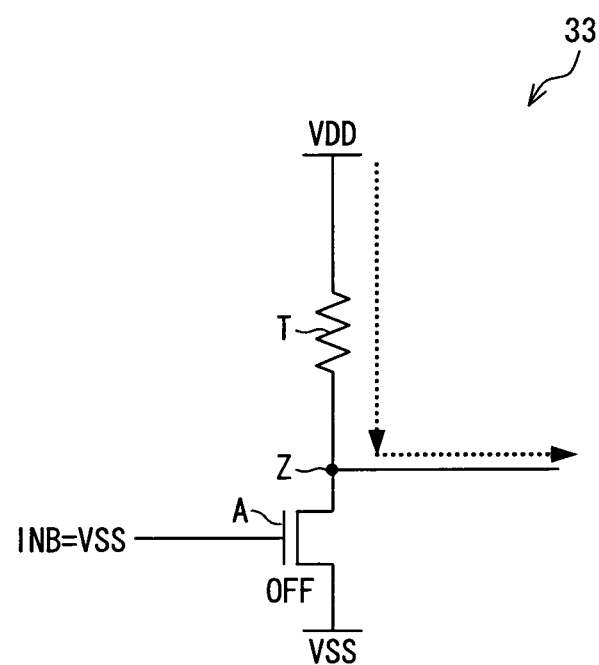

F I G. 1 0
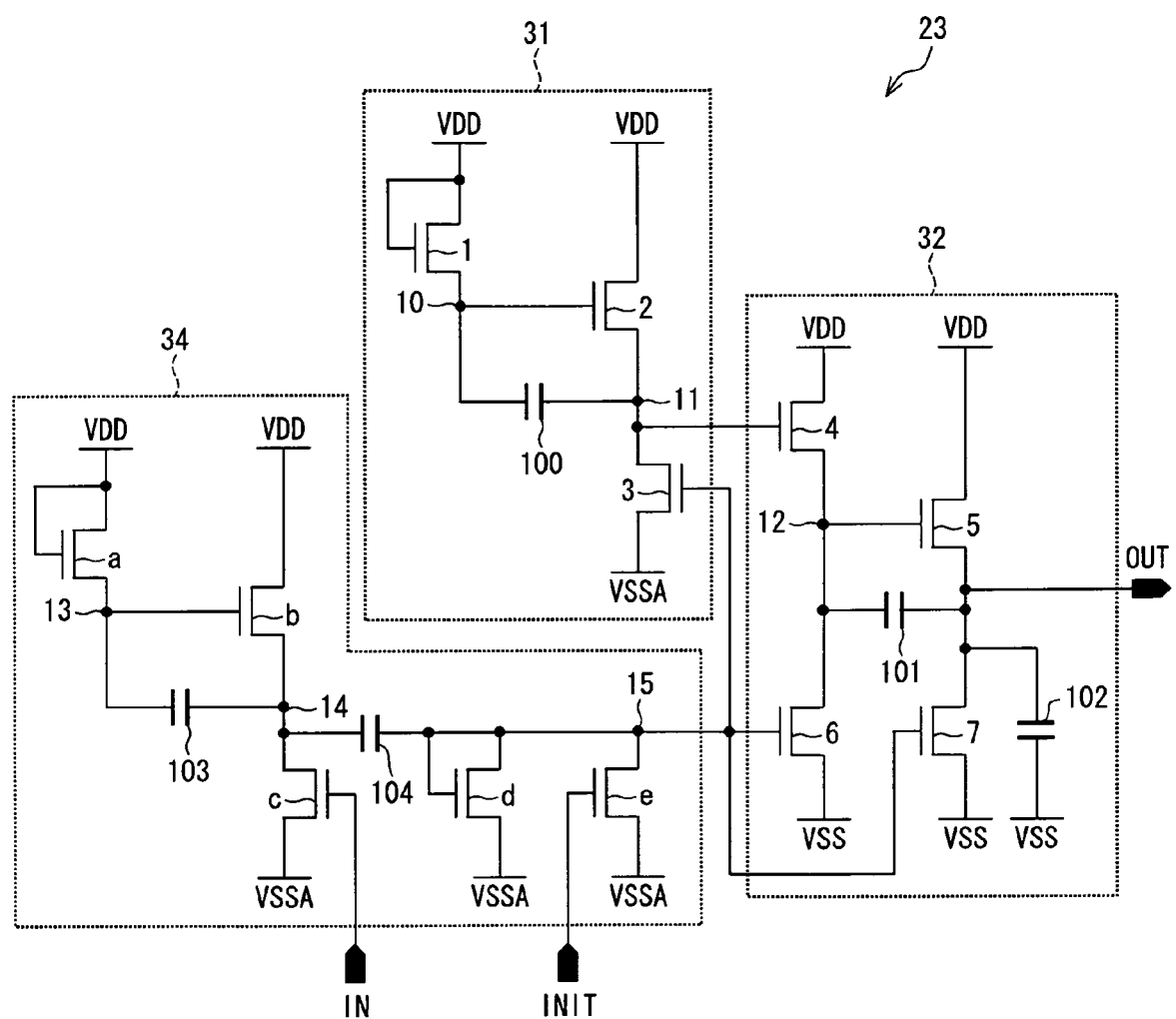

F I G. 1 4
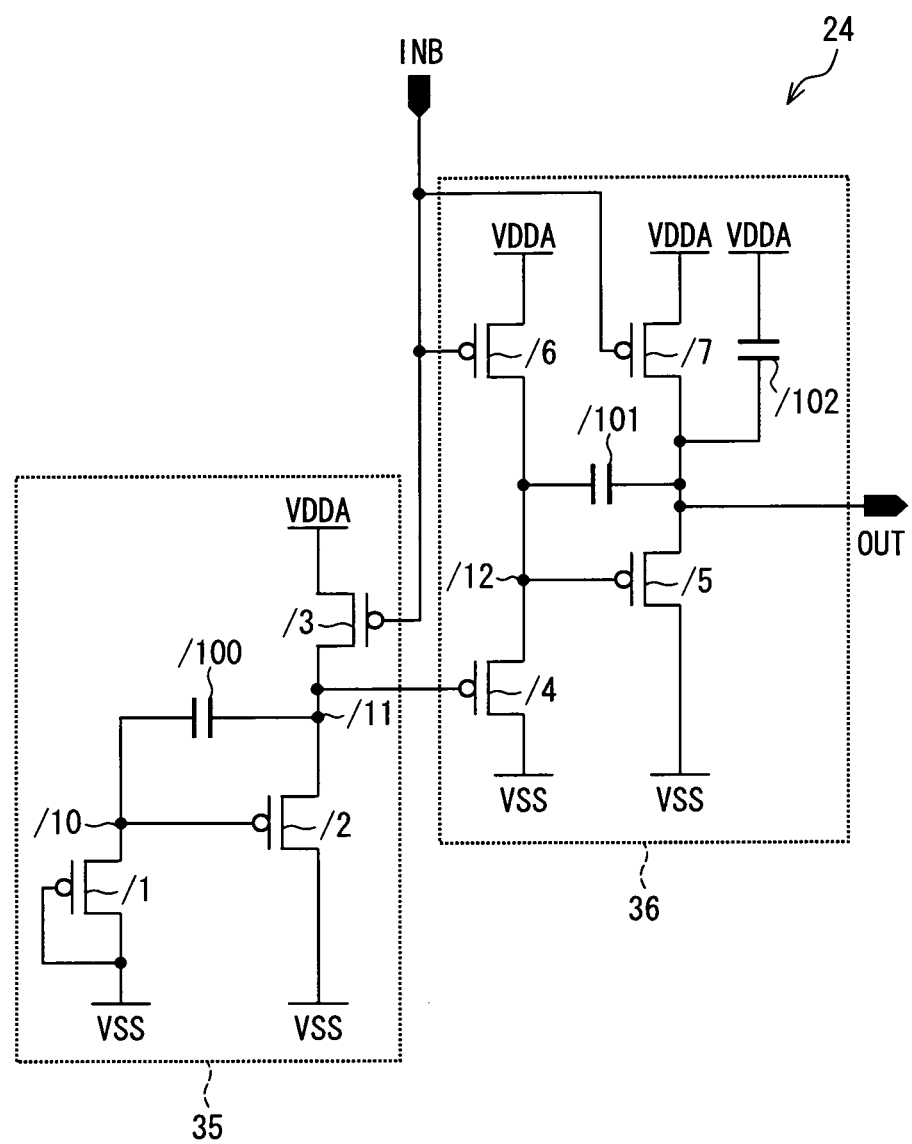

F I G. 1 8
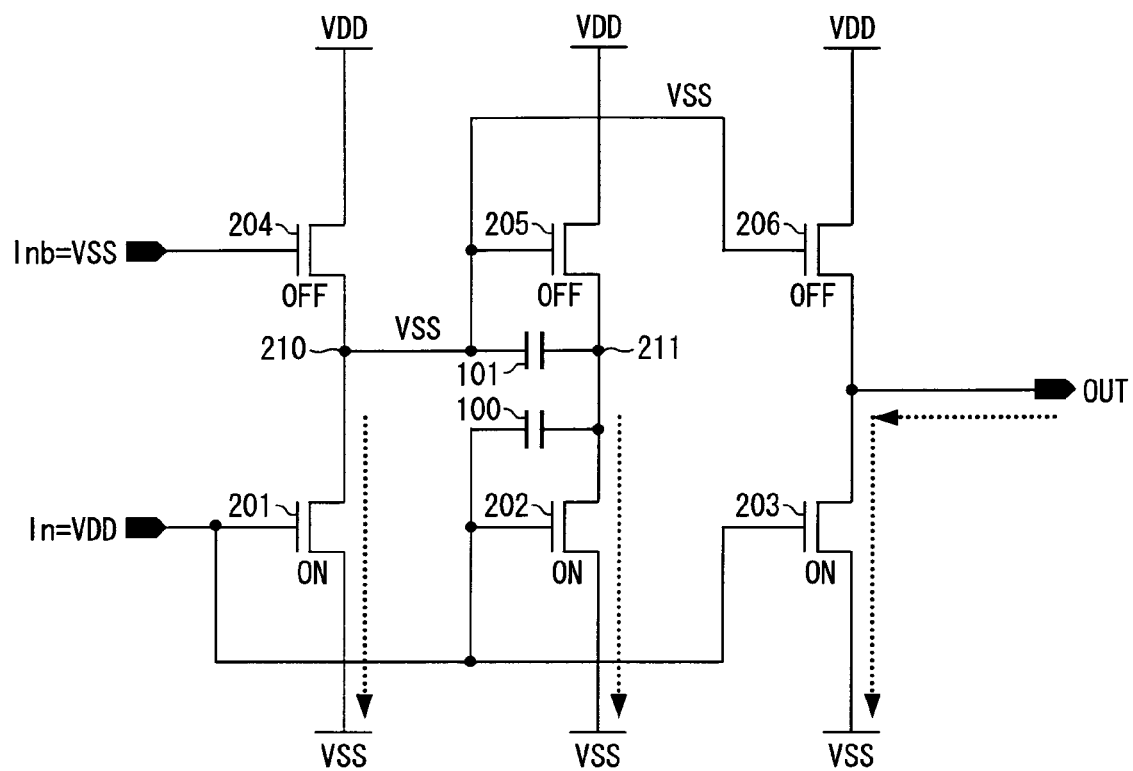

F I G. 1 9
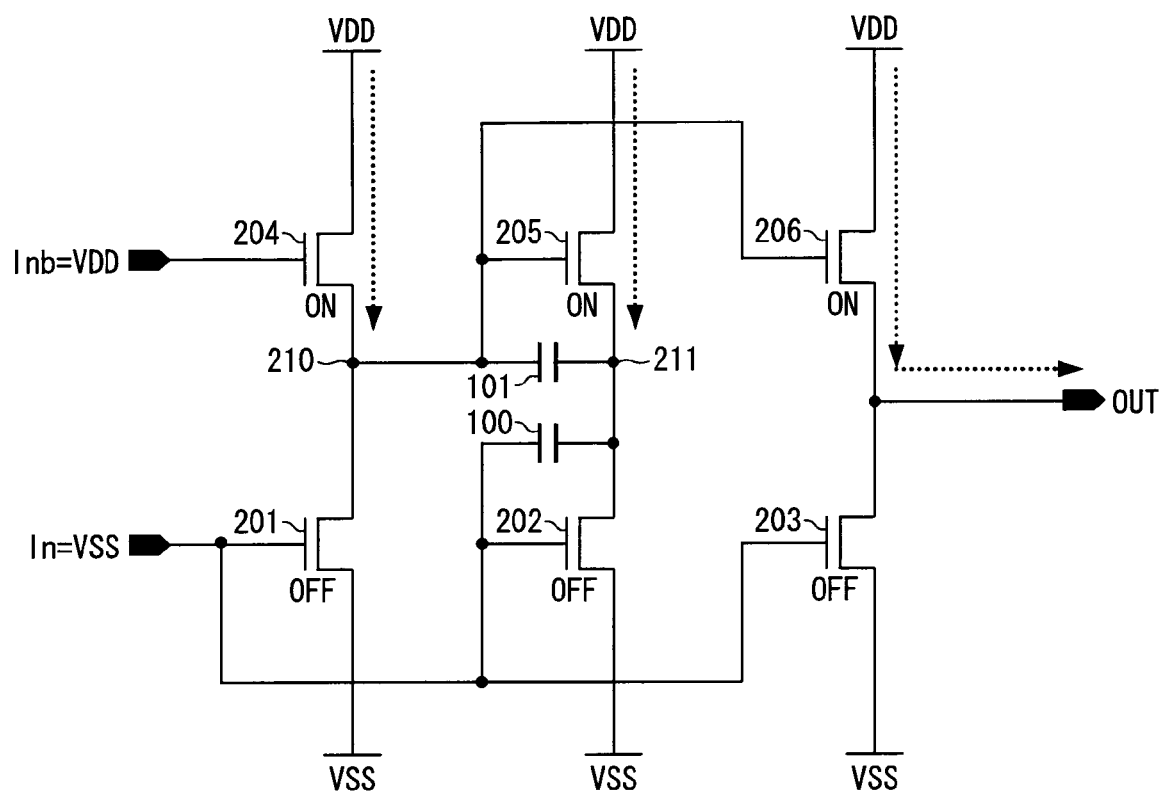

F I G. 2 0
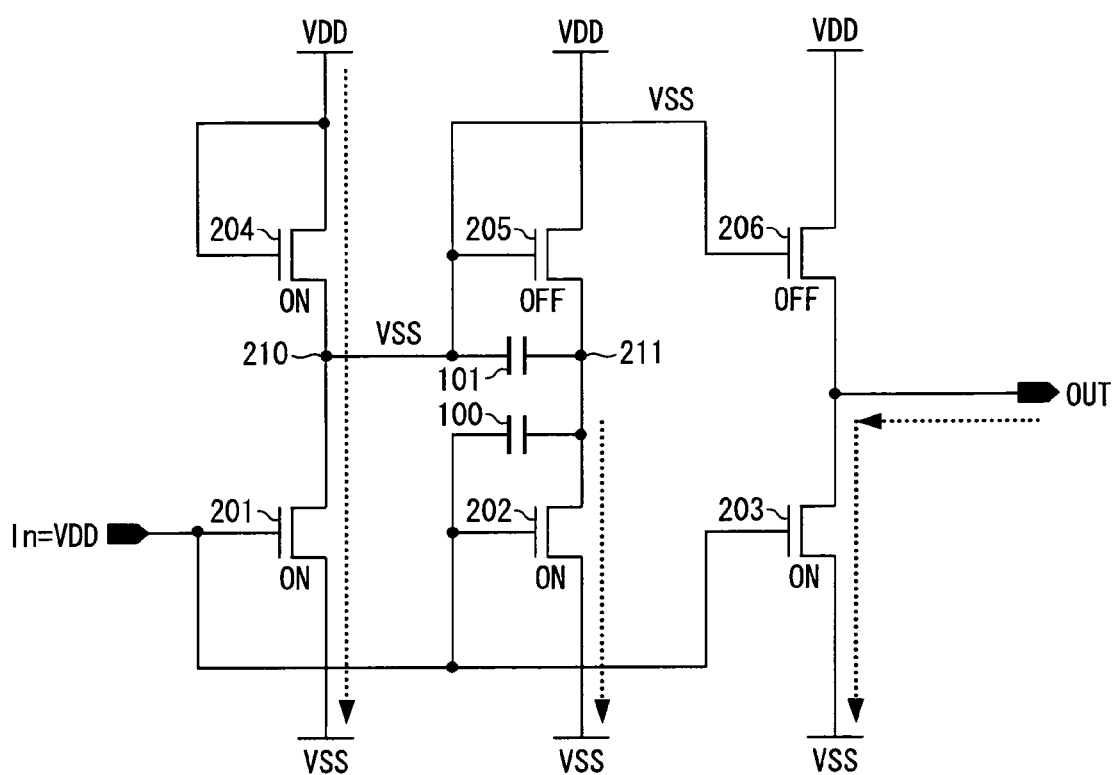

F I G. 2 7
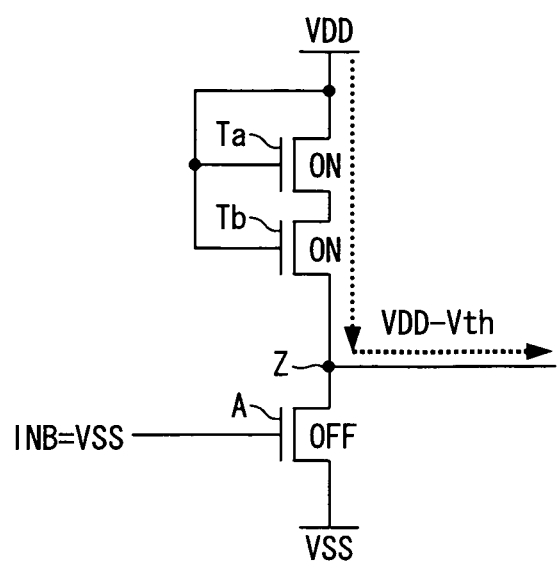

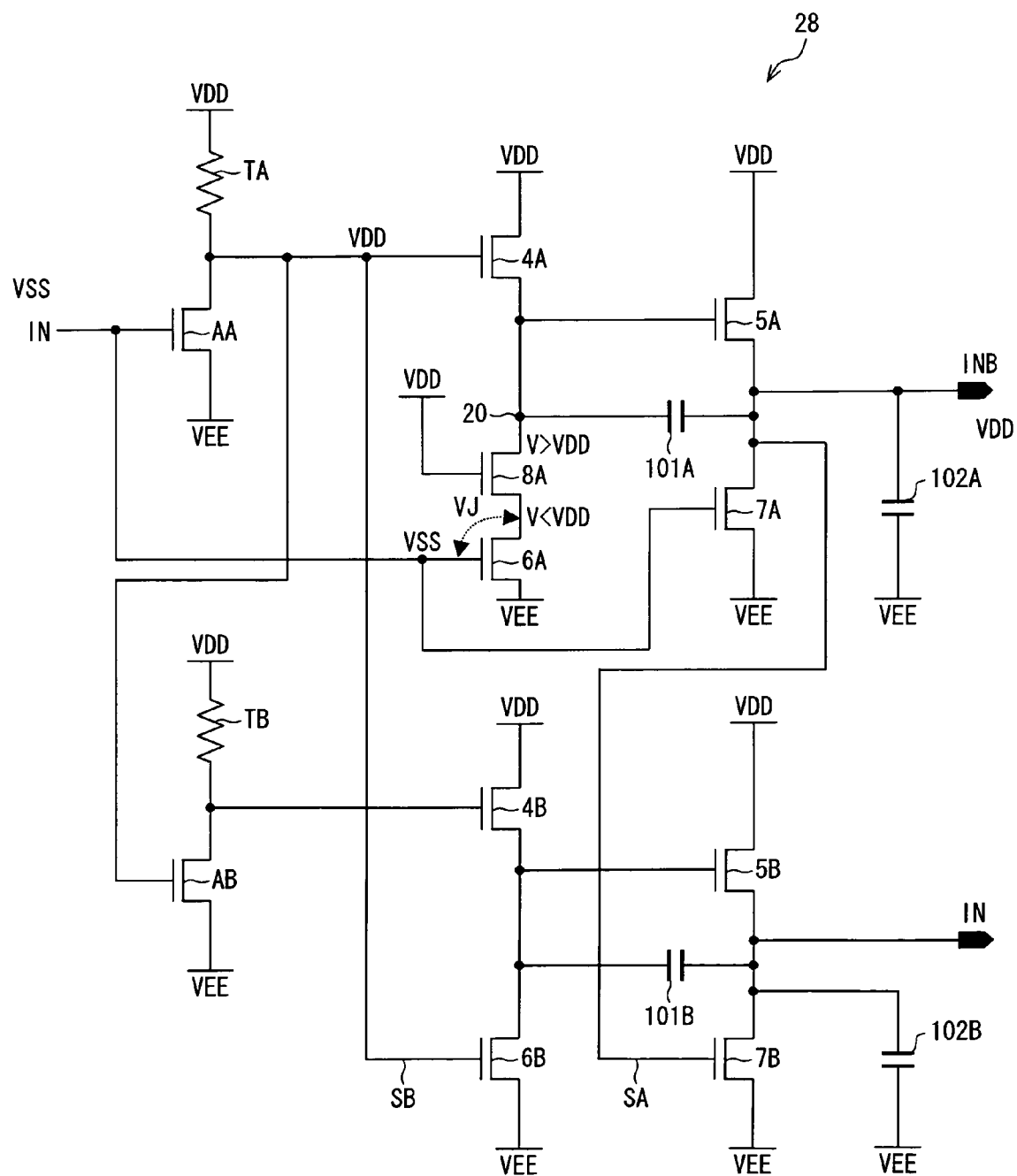
F I G. 30

BUFFER AND DISPLAY DEVICE

TECHNICAL FIELD

The present invention relates to a buffer including transistors all of which have only a single type of channel polarity.

BACKGROUND ART

A liquid crystal display device may include a buffer having a low output impedance and outputting an amplified (in broad sense of the term) signal. A member so called buffer can be a level-shifter for performing a translation of a source voltage or an amplifier for receiving an input signal and outputting an amplified signal with unity gain. In a case where the buffer includes CMOS transistors, it is required that p-channel transistors and n-channel transistors be formed in respective processes. The buffer may include transistors all of which have only a single type of channel polarity, such as n-channel, so that the forming steps can be simplified (see, for example, Patent Literature 1).

FIGS. 18 and 19 each show an example of a configuration of a buffer which includes n-channel transistors but no p-channel transistors. The buffer has input terminals In and Inb for a set of inputs with opposite phases.

As shown in FIG. 18, transistors 201 through 203 have respective sources connected to VSS. In a case where the input terminal In receives VDD and the input terminal Inb receives VSS, the transistors 201 through 203, having respective gates connected to the input terminal In, are turned ON, while a transistor 204, having a gate connected to the input terminal Inb and a drain connected to VDD, is turned OFF. Thus, an electric potential at a point 210, at which the transistors 201 and 204 are connected to each other, is caused to be VSS. The point 210 is connected to a gate of a transistor 205 and that of a transistor 206, the transistor 205 connected to a VDD side of the transistor 202 in series and the transistor 206 connected a VDD side of the transistor 203 in series. The transistors 205 and 206 have respective drains connected to VDD.

Thus, the transistors 205 and 206 are turned OFF.

Since the transistor 206 is turned OFF and the transistor 203 is turned ON, VSS is outputted to an output terminal OUT.

As shown in FIG. 19, in a case where the input terminal In receives VSS and the input terminal Inb receives VDD, the transistors 201 through 203 are turned OFF, while the transistor 204 is turned ON. Thus, an electric potential at the point 210 is increased to be "VDD−threshold voltage Vth of the transistor 204". As the electric potential at the point 210 is increased, the transistor 205 becomes turned ON, thereby causing an increase in a drain current of the transistor 205. Then, the transistor 204 is turned OFF at a time when the electric potential of the point 210 reaches "VDD−threshold voltage Vth of the transistor 204".

A bootstrap capacitor 101 is connected between the gate and the source of the transistor 205. In a case where an electric potential at a point 211, which is connected to the source of the transistor 205, is increased, the bootstrap capacitor 101 causes the electric potential at the point 210 to be instantaneously increased. In consideration, by designing such that the electric potential at the point 210 is instantaneously increased to be "VDD+threshold voltage Vth of the transistor 205" or higher, it is possible to cause the electric potential at the point 211 to be increased to VDD without being decreased in voltage by the degree of the threshold voltage Vth. A capacitor 100 is connected between the drain and the gate of the transistor 202.

Since the electric potential at the point 210 is inputted also to the gate of the transistor 206, an output to the output terminal OUT is VDD which is not decreased in voltage by the threshold voltage Vth.

With reference to FIGS. 20 and 21, the following describes another example of a configuration of the buffer which includes n-channel transistors but no p-channel transistor. The buffer is a single-phase input buffer including only an input terminal In. According to a configuration shown in FIGS. 20 and 21, an input terminal Inb as shown in FIGS. 18 and 19 is removed, and a transistor 204 has a gate and a drain connected to each other.

As shown in FIG. 20, in a case where the input terminal In receives VDD, transistors 201 through 203 are turned ON. This causes an electric potential at a point 210 to be VSS, such that a drain-to-source voltage, i.e., a gate-to-source voltage, of the transistor 204 is caused to be "VDD−VSS". Thus, the transistor 204 is turned ON, and by this, a pass-through current passing through the transistor 204 is generated. According to the configuration shown in FIG. 20, a size ratio between the transistors 204 and 201 is set such that the electric potential at the point 210 will be closer to VSS. The electric potential at the point 210 is inputted to respective gates of the transistors 205 and 206, such that both the transistors 205 and 206 are turned OFF. Since the transistor 203 is turned ON and the transistor 206 is turned OFF, VSS is outputted via an output terminal OUT.

As shown in FIG. 21, in a case where the input terminal In receives VSS, the transistors 201 through 203 are turned OFF, while the transistor 204 is turned ON as in the case with FIG. 20. This causes the electric potential at the point 210 to be increased from VSS toward "VDD−threshold voltage Vth of the transistor 204". As the electric potential at the point 210 is increased, the transistor 205 becomes turned ON, thereby causing an increase in a drain current of the transistor 205. Then, the transistor 205 is turned OFF at a time when the electric potential at the point 210 reaches "VDD−threshold voltage Vth of the transistor 204".

In the above condition, in a case where the electric potential at the point 211 is increased, the bootstrap capacitor 101 causes the electric potential at the point 210 to be instantaneously increased. In consideration, by designing such that the electric potential at the point 210 is instantaneously increased to "VDD+threshold voltage Vth of the transistor 205" or higher, it is possible to cause the electric potential at the point 211 to be increased to VDD without being decreased in voltage by the degree of the threshold voltage Vth.

The electric potential at the point 210 is inputted also to the gate of the transistor 206. Consequently, an output to the output terminal OUT is VDD which is not decreased in voltage by the threshold voltage Vth.

In the case with the single-phase input buffer as shown in FIGS. 20 and 21, the pass-through current is generated. Thus, it is required that a consumption current be reduced. In practice, however, the pass-through current is prevented by designing a transistor 204 having a narrower channel width W or replacing the transistor 204 with a resistor having a high resistance value.

FIG. 22 shows a configuration in which the transistor 204 is replaced by a resistor T having a high resistance value. In the configuration, the pass-through current is reduced by the resistor T. According to the configuration, (i) in a case where the input terminal In receives VDD, the output terminal OUT has the same electric potential as in the case with FIG. 20, and (ii) in a case where the input terminal In receives VSS, the output terminal OUT has the same electric potential as in the case with FIG. 21.

CITATION LIST

Patent Literature 1
Japanese Patent Application Publication, Tokukai, No. 2003-179476 A (Publication Date: Jun. 27, 2003)

SUMMARY OF INVENTION

However, according to the configuration shown in FIG. 22 in which the conventional buffer including transistors all of which have only a single type of channel polarity is the single-phase input buffer, it takes longer before the electric potential at the point 210 reaches VDD, since the pass-through current is prevented by the resistor T having the high resistance value. In the configuration, the electric potential at the point 210 is inputted to the respective gates of the transistors 205 and 206. Thus, after the input terminal In receives VSS, it also takes longer before the transistors 205 and 206 are turned ON. In a case where the output terminal OUT is connected to a large capacitive load, this causes a delay in outputting from the output terminal OUT.

In order to reduce such delay in the outputting, it is required that a current drive for the buffer be enhanced by replacing the resistor having the high resistance value with a resistor having a lower resistance value or a transistor having a large channel width W. However, after all, this will remove the countermeasures employed against the pass-through current, thereby resulting in an increase in the consumption current.

The present invention is made in view of the problem, and an object of the present invention is to provide (i) a single-phase input buffer including transistors all of which have only a single type of channel polarity, with which single-phase input buffer it is possible that a consumption current be reduced and a current drive for a load be enhanced, and (ii) a display device including the single-phase input buffer.

In order to attain the object, a buffer according to the present invention is a buffer for providing an impedance transformation for an input signal so as to output an output signal, the buffer including: a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points; and an inverted-signal generating section for generating an inverted signal, the inverted-signal generating section including an n-channel transistor but no p-channel transistor, and generating the inverted signal, a polarity of which inverted signal is opposite to the input signal and a signal level of which inverted signal is a predetermined signal level, the input signal being inputted to a gate of that one of the two n-channel transistors forming the first series circuit which is provided closer to the Low voltage source, and that one of the two n-channel transistors forming the second series circuit which is provided closer to the Low voltage source, the inverted signal being inputted to a gate of the other of the two n-channel transistors forming the first series circuit which is provided closer to the High voltage source, and the output signal being outputted via the connection point at which the two n-channel transistors forming the second series circuit are connected to each other in series.

According to the invention, the first capacitor connected between the connection points has a function of a bootstrap capacitor, such that even in a case where the transistors of the first series circuit have a poor current drive, it is possible to sufficiently drive, by instantaneously increasing an electrical potential, that one of the two transistors forming the second series circuit which has the gate connected to the first series circuit. In the first series circuit, it is possible that (i) the pass-through current be prevented since it is not required that a notably large current be supplied in the first series circuit, and (ii) it take less before an output voltage is generated. In the case with a single-phase input buffer including one input terminal, the first series circuit receives the inverted signal generated from the input signal by the inverted-signal generating section. Thus, it is further possible that the buffer section generate an output voltage which is not decreased in voltage by the degree of the threshold voltage.

The above brings about an effect that realizes the single-phase input buffer including transistors all of which have only a single type of channel polarity, with which single-phase input buffer it is possible that a consumption current be reduced and a current drive for a load be enhanced.

In order to attain the object, a buffer according to the present invention is a buffer for providing an impedance transformation for an input signal so as to output an output signal, the buffer including: a buffer section, including (i) a first series circuit between a High voltage source and a Low voltage source, which first series circuit is formed by two p-channel transistors connected to each other in series at a connection point, (ii) a second series circuit between the High voltage source and the Low voltage source, which second series circuit is formed by two p-channel transistors connected to each other in series at a connection point, and (iii) a first capacitor between the connection points; and an inverted-signal generating section for generating an inverted signal, the inverted-signal generating section including a p-channel transistor but no n-channel transistor, and generating the inverted signal, a polarity of which inverted signal is opposite to the input signal and a signal level of which inverted signal is a predetermined signal level, the input signal being inputted to a gate of that one of the two p-channel transistors forming the first series circuit which is provided closer to the High voltage source, and that one of the two p-channel transistors forming the second series circuit which is provided closer to the High voltage source, the inverted signal being inputted to a gate of the other of the two p-channel transistors forming the first series circuit which is provided closer to the Low voltage source, and the output signal being outputted via the connection point at which the two p-channel transistors forming the second series circuit are connected to each other in series.

According to the invention, the first capacitor connected between the connection points has a function of a bootstrapping capacitor, such that even in a case where the transistors of the first series circuit have a poor current drive, it is possible to sufficiently drive, by instantaneously increasing the electrical potential, that one of the two transistors forming the second series circuit which has the gate connected to the first series circuit. In the first series circuit, it is possible that (i) the pass-through current be prevented since it is not required that a notably large current be supplied in the first series circuit, and (ii) it take less before an output voltage is generated. In the case with a single-phase input buffer including one input terminal, the first series circuit receives the inverted signal generated from the input signal by the inverted-signal generating section. Thus, it is further possible that the buffer section generate an output voltage which is not decreased in voltage by the degree of the threshold voltage.

The above brings about an effect that realize the single-phase input buffer including transistors all of which have only a single type of channel polarity, with which single-phase input buffer it is possible that a consumption current be reduced and a current drive for a load be enhanced.

In order to attain the object, the buffer according to the present invention is configured such that the inverted-signal generating section includes a first transistor, a second transistor, a third transistor, and a second capacitor, the third transistor having a gate for receiving the input signal, the second transistor being connected to the third transistor in series at a connection point, the first transistor having a gate and a drain connected to each other and a source connected to a gate of the second transistor, the second capacitor connected between the source of the first transistor and the connection point at which the second transistor and the third transistor are connected to each other in series, the drain of the first transistor and that of the second transistor each connected to either one of a High voltage source and a Low voltage source of the inverted-signal generating section, and a source of the third transistor connected to the other of the High voltage source and the Low voltage source of the inverted-signal generating section, and the inverted signal being outputted via the connection point at which the second transistor and the third transistor are connected to each other in series.

According to the invention, the second capacitor has a function of a bootstrapping capacitor such that the inverted signal, which is not decreased in voltage by the degree of the threshold voltage, can be obtained. This brings about an effect that makes it easier that the buffer section receiving the inverted signal outputs the output signal not decreased in voltage by the degree of the threshold voltage.

In order to attain the object, the buffer according to the present invention is configured such that the inverted-signal generating section includes a first transistor, a second transistor group, a third transistor, and a second capacitor, the third transistor having a gate for receiving the input signal, the second transistor group (A) formed of a plurality of transistors connected to one another in cascade, and (B) connected to the third transistor in series at a connection point, the first transistor having a gate and a drain connected to one each other and a source connected to respective gates of the plurality of transistors forming the second transistor group, the second capacitor connected between the source of the first transistor and the connection point at which the second transistor group and the third transistor are connected to each other in series, and the drain of the first transistor and a drain end of the second transistor group each connected to either one of a High voltage source and a Low voltage source of the inverted-signal generating section, and a source of the third transistor connected to the other of the High voltage source and the Low voltage source of the inverted-signal generating section, and the inverted signal being outputted via the connection point at which the second transistor group and the third transistor are connected to each other in series.

According to the invention, the second capacitor has a function of a bootstrapping capacitor such that the inverted signal, which is not decreased in voltage by the degree of the threshold voltage, can be obtained. This brings about an effect that makes it easier that the buffer section receiving the inverted signal outputs the output signal not decreased in voltage by the degree of the threshold voltage.

According to the invention, furthermore, the inverted-signal generating section includes the second transistor group formed of the plurality of transistors connected to one another in cascade. This brings about an effect that prevents the pass-through current by providing a greater resistance of a current path.

In order to attain the object, the buffer according to the present invention is configured such that the inverted-signal generating section includes a fourth transistor and a resistor, the fourth transistor having a gate for receiving the input signal, the fourth transistor and the resistor connected to each other in series, a source of the fourth transistor connected to either one of a High voltage source and a Low voltage source of the inverted-signal generating section, and that end of the resistor, to which no fourth transistor is connected, connected to the other of the High voltage source and the Low voltage source of the inverted-signal generating section, and the inverted signal being outputted via the connection point at which the fourth transistor and the resistor are connected to each other in series.

According to the invention, the resistor is employed in order that the inverted signal can be obtained. This brings about an effect that reduces a circuit in a layout area, and that eliminates the need for a configuration for correcting the decrease in voltage by the degree of the threshold voltage which is caused due to the transistor.

In order to attain the object, the buffer according to the present invention is configured such that the inverted-signal generating section includes a fourth transistor and a fifth transistor having a gate and a drain connected to each other, the fourth transistor having a gate for receiving the input signal, the fourth transistor and the fifth transistor connected to each other in series, a source of the fourth transistor connected to either one of a High voltage source and a Low voltage source of the inverted-signal generating section, and a drain of the fifth transistor connected to the other of the High voltage source and the Low voltage source of the inverted-signal generating section, and the inverted signal being outputted via the connection point at which the fourth transistor and the fifth transistor are connected to each other in series.

According to the invention, the fifth transistor, which is the diode-connected transistor, is used as a resistor in order that the inverted signal can be obtained. This brings about an effect that eliminates the need for a bootstrap capacitor so that a circuit can be reduced in a layout area.

In order to attain the object, the buffer according to the present invention is configured such that the inverted-signal generating section includes: a fourth transistor; and a fifth transistor group formed by a diode-connected transistor and one or more transistors, the diode-connected transistor having a gate and a drain connected to each other and a source connected to the one or more transistors that are connected to one another in cascade, respective gates of the one or more transistors connected to the gate of the diode-connected transistor, the fourth transistor having a gate for receiving the input signal, the fourth transistor and the fifth transistor group connected to each other, via a source end of the fifth transistor group, in series at a connection point, a source of the fourth transistor connected to either one of a High voltage source and a Low voltage source of the inverted-signal generating section, and a drain of the diode-connected transistor connected to the other of the High voltage source and the Low voltage source, and the inverted signal being outputted via the connection point at which the fourth transistor and the fifth transistor group are connected to each other in series.

According to the invention, the fifth transistor group, which is formed by the diode-connected transistor and the one or more transistors connected to one another in cascade, is used as a resistor. This brings about an effect that eliminates the need for a bootstrap capacitor so that a circuit can be reduced in a layout area.

In order to attain the object, a buffer according to the present invention is a buffer for providing an impedance transformation for an input signal so as to output an output signal, the buffer including: a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a capacitor between the connection points, an input-signal level translating section for generating a level translated signal, the input-signal level translated section including an n-channel transistor but no p-channel transistor, and performing a level translation on the input signal so as to generate the level translated signal, and an inverted-signal generating section for generating an inverted signal, the inverted-signal generating section including an n-channel transistor but no p-channel transistor, and generating the inverted signal on a reception of the level translated signal, a polarity of which inverted signal is opposite to the input signal and a signal level of which inverted signal is a predetermined signal level, the level translated signal being inputted to a gate of that one of the two n-channel transistors forming the first series circuit which is provided closer to the Low voltage source, and a gate of that one of the two n-channel transistors forming the second series circuit which is provided closer to the Low voltage source, the inverted signal being inputted to a gate of the other of the two n-channel transistors forming the first series circuit which is provided closer to the High voltage source, and the output signal being outputted via the connection point at which the two n-channel transistors forming the second series circuit are connect to each other in series.

According to the invention, the first capacitor connected between the connection points has a function of a bootstrap capacitor, such that even in a case where the transistors of the first series circuit have a poor current drive, it is possible to sufficiently drive, by instantaneously increasing the electrical potential, that one of the transistors forming the second series circuit which has the gate connected to the first series circuit. In the first series circuit, (i) it is possible that the pass-through current be prevented since it is not required that a notably large current is supplied in the first series circuit, and (ii) it take less before an output voltage is generated. In the case with the single-phase input buffer including one input terminal, the first series circuit receives the inverted signal generated by the inverted-signal generating section. Thus, it is further possible that the buffer section generate an output voltage not decreased in voltage by the degree of the threshold voltage.

This brings about an effect that realizes the single-phase input buffer including the transistors all of which have only a single type of channel polarity, with which single-phase input buffer it is possible that a consumption current be prevented and a current drive for a load be enhanced.

According to the invention, furthermore, the buffer section includes the input-signal level translating section. This brings about an effect that avoids a problem in that in the buffer section, that one of the transistors which receives the input signal cannot be turned OFF due to the signal level of the input signal.

In order to attain the object, a buffer according to the present invention is a buffer for providing an impedance transformation for an input signal so as to output an output signal, the buffer including: a buffer section, including (i) a first series circuit between a High voltage source and a Low voltage source, which first series circuit is formed by two p-channel transistors connected to each other in series at a connection point, (ii) a second series circuit between the High voltage source and the Low voltage source, which second series circuit is formed by two p-channel transistors connected to each other in series at a connection point, and (iii) a first capacitor between the connection points; an input-signal level translating section for generating a level translated signal, the input-signal level translating section including a p-channel transistor but no n-channel transistor, and performing a level translation on a reception of the input signal so as to generate the level translated signal; and an inverted-signal generating section for generating an inverted signal, the inverted-signal generating section including a p-channel transistor but no n-channel transistor, and generating the inverted signal on a reception of the level translated signal, a polarity of which inverted signal is opposite to the input signal and a signal level of which inverted signal is a predetermined signal level, the level translated signal being inputted to a gate of that one of the two p-channel transistors forming the first series circuit which is provided closer to the High voltage source, and a gate of that one of the two p-channel transistors forming the second series circuit which is provided closer to the High voltage source, the inverted signal being inputted to a gate of the other of the two p-channel transistors forming the first series circuit which is provided closer to the Low voltage source, and the output signal being outputted via the connection point at which the two p-channel transistors forming the second series circuit are connect to each other in series.

According to the invention, the first capacitor connected between the connection points has a function of a bootstrap capacitor, such that even in a case where the transistors of the first series circuit have a poor current drive, it is possible to sufficiently drive, by instantaneously increasing the electrical potential, that one of the transistors forming the second series circuit which has the gate connected to the first series circuit. In the first series circuit, it is possible that (i) a pass-through current be prevented since it is not required that a notably large current be supplied in the first series circuit, and (ii) it take less before an output voltage is generated. In the case with the single-phase input buffer including one input terminal, the first series circuit receives the inverted signal generated by the inverted-signal generating section. Thus, it is further possible that the buffer section generate an output voltage not decreased in voltage by the degree of the threshold voltage.

The above brings about an effect that realizes the single-phase input buffer including the transistors all of which have only a single type of channel polarity, with which single-phase input buffer it is possible that a consumption current be prevented and a current drive for a load be enhanced.

According to the invention, furthermore, the buffer section includes the input-signal level translating section. This brings about an effect that avoids a problem in that in the buffer section, that one of the transistors which receives the input signal cannot be turned OFF due to a signal level of the input signal.

In order to attain the object, the buffer according to the present invention is configured such that the inverted-signal generating section includes a first transistor, a second transistor, a third transistor, and a second capacitor, the second transistor and the third transistor connected to each other in series at a connection point, the first transistor having a gate and a drain connected to each other and a source connected to a gate of the second transistor, the second capacitor connected between the source of the first transistor and the connection point at which the third transistor and the second transistor are connected to each other in series, the drain of the first transistor and that of the second transistor each connected to either one of a High voltage source and a Low voltage source of the inverted-signal generating section, and a source of the third transistor connected to the other of the High voltage source and the Low voltage source of the inverted-signal generating section, the third transistor having a gate for receiving the level translated signal, and the inverted signal being outputted via the connection point at which the second transistor and the third transistor are connected to each other in series.

According to the invention, the second capacitor has a function of a bootstrap capacitor such that the inverted signal, which is not decreased in voltage by the degree of the threshold voltage, can be obtained. This brings about an effect that makes it easier that the buffer section receiving the inverted signal outputs the output signal not decreased in voltage by the degree of the threshold voltage.

In order to attain the object, the buffer according to the present invention is configured such the inverted-signal generating section includes a first transistor, a second transistor group, a third transistor, and a second capacitor, the second transistor group (A) formed by a plurality of transistors connected to one another in cascade, and (B) connected to the third transistor in series at a connection point, the first transistor having a gate and a drain connected to each other and a source connected to respective gates of the plurality of transistors forming the second transistor group, the second capacitor connected between the source of the first transistor and the connection point at which the second transistor group and the third transistor are connected to each other in series, the drain of the first transistor and a drain end of the second transistor group each connected to either one of a High voltage source and a Low voltage source of the inverted-signal generating section, and a source of the third transistor connected to the other of the High voltage source and the Low voltage source of the inverted-signal generating section, the level translated signal being inputted to the gate of the third transistor, and the inverted signal being outputted via the connection point at which the second transistor group and the third transistor are connected each other in series.

According to the invention, the second capacitor has the function of the bootstrap capacitor such that the inverted signal, which is not decreased in voltage by the degree of the threshold voltage of the transistor, can be obtained. This brings about an effect that makes it easier that the buffer section receiving the inverted signal outputs the output signal not decreased in voltage by the degree of the threshold voltage.

According to the invention, furthermore, the buffer section includes the second transistor group formed by the plurality of transistors connected to one another in cascade. This brings about an effect that prevents a pass-through current by providing a higher resistance of a current path.

In order to attain the object, the buffer according to the invention is configured such that the inverted-signal generating section includes a fourth transistor and a resistor, the fourth transistor and the resistor connected to each other in series at a connection point, a source of the fourth transistor connected to either one of a High voltage source and a Low voltage source of the inverted-signal generating section, and that end of the resistor, to which no fourth transistor is connected, connected to the other of the High voltage source and the Low voltage source of the inverted-signal generating section, the level translated signal being inputted to the gate of the fourth transistor, and the inverted signal being outputted via the connection point at which the fourth transistor and the resistor are connected each other in series.

According to the invention, the resistor is employed in order that the inverted signal can be obtained. This brings about an effect that eliminates (i) the need for the bootstrap capacitor so that a circuit can be reduced in a layout area, and (ii) the need for a configuration for correcting the decrease in voltage by the degree of the threshold voltage which is caused due to the transistor.

In order to attain the object, the buffer according to the invention is configured such that the inverted-signal generating section includes a fourth transistor and a fifth transistor that has a gate and a drain connected to each other, the fourth transistor and the fifth transistor connected to each other in series at a connection point, a source of the fourth transistor connected to either one of a High voltage source and a Low voltage source of the inverted-signal generating section, and the drain of the fifth transistor connected to the other of the High voltage source and the Low voltage source of the inverted-signal generating section, the inverted signal being inputted to the gate of the fourth transistor, and the inverted signal being outputted via the connection point at which the fourth transistor and the fifth transistor are connected to each other in series.

According to the invention, the fifth transistor, which is the diode-connected transistor, is employed as the resistor in order that the inverted signal can be obtained. This brings about an effect that eliminates the need for the bootstrap capacitor so that a circuit can be reduced in a layout area.

In order to attain the object, the buffer according to the present invention is configured such that the inverted-signal generating section includes: a fourth transistor; and a fifth transistor group formed by a diode-connected transistor and one or more transistors, the diode-connected transistor having a gate and a drain connected to each other and a source connected to the one or more transistors that are connected to one another in cascade, respective gates of the one or more transistors connected to the gate of the diode-connected transistor, the fourth transistor and the fifth transistor group connected to each other, via a source end of the fifth transistor group, in series at a connection point, a source of the fourth transistor connected to either one of a High voltage source and a Low voltage source of the inverted-signal generating section, and the drain of the diode-connected transistor connected to the other of the High voltage source and the Low voltage source of the inverted-signal generating section, the level translated signal being inputted to the gate of the fourth transistor, and the inverted signal being outputted via the connection point at which the fourth transistor and the fifth transistor group are connected to each other.

According to the invention, the fifth transistor group, which is formed by the diode-connected transistor and the one or more transistors connected to one another in cascade, is employed as a resistor. This brings about an effect that eliminates the need for a bootstrap capacitor so that a circuit can be reduced in a layout area.

In order to attain the object, the buffer according to the present invention is configured such that the input-signal level translating section includes (x) a first level-translating-section transistor, a second level-translating-section transistor, a third level-translating-section transistor, and a fourth level-translating-section transistor each formed by the channel transistor, and (y) a first level-translating-section capacitor and a second level-translating-section capacitor each formed by a capacitor, the second level-translating-section transistor and the third level-translating-section transistor connected to each other in series at a connection point, the first level-translating-section transistor having a gate and a drain connected to each other and a source connected to a gate of the second level-translating-section transistor, the first level-translating-section capacitor connected between the source of the first level-translating-section transistor and the connection point at which the second level-translating-section transistor and the third level-translating-section transistor are connected to each other in series, the second level-translating-section capacitor having one end connected to the connection point at which the second level-translating-section transistor and the third level-translating-section transistor are connected to each other in series, the fourth level-translating-section transistor having a drain and a gate each connected to the other end of the second level-translating-section capacitor, the fifth level-translating-section transistor having a drain connected to the other end of the second level-translating-section capacitor, the drain of the first level-translating-section transistor and that of the second level-translating-section transistor each connected to either one of a High voltage source and a Low voltage source of the inverted-signal generating section, respective sources of the third level-translating-section transistor, the fourth level-translating-section transistor, and the fifth level-translating-section transistors each connected to the other of the High and the Low voltage source of the inverted-signal generating section, the input signal being inputted to the gate of the third level-translating-section transistor, a switching signal for switching a state of the fifth level-translating-section transistor between ON and OFF being able to be inputted to the gate of the fifth level-translating-section transistor, and the level translated signal being outputted via the other end of the second level-translating-section capacitor.

According to the invention, the input-signal level translating section is configured such that the fifth level-translating-section transistor receives, via the gate, (i) the signal for causing the fifth level-translating-section transistor to be turned ON and then (ii) the signal for causing it to be turned OFF. This makes it possible that the other end of the second level-translating-section capacitor have the same electric potential as the either one of the High voltage source and the Low voltage source connected to the source of the fifth level-translating-section transistor.

According to the invention, furthermore, in a case where the third level-translating-section transistor receives, via the gate, the input signal for causing the third level-translating-section to be turned ON, it is possible that the following transistors (i) through (iii) be turned OFF with certainty due to an effect of instantaneous increasing or instantaneous decreasing of the electrical potentials brought about by the second level-translating-section capacitor, the transistor (i) being the third transistor in the inverted-signal generating section which receives the level-translated signal, the transistor (ii) being that one of the transistors forming the first series circuit of the buffer section which receives the level-translated signal, and the transistor (iii) being that one of the transistors forming the second series circuit of the buffer section which receives the level-translated signal.

According to the invention, moreover, in a case where the third level-translating-section transistor receives, via the gate, the input signal for causing the third level-translating-section transistor to be turned ON, the fourth transistor is turned ON, thereby preventing the other end of the second level-translating-section capacitor from having an electric potential that causes the transistors (i) through (iii) to be turned OFF. Thus, it is possible that the transistors (i) through (iii) be kept turned OFF.

The above brings about an effect that turns OFF the transistors (i) through (iii) with certainty.

In order to attain the object, the buffer according to the present invention is configured such that the buffer section further includes a third capacitor, which is connected to the connection point at which the two transistors forming the second series circuit are connected to each other.

According to the invention, the third capacitor is electrically charged by an output voltage of the buffer, such that the output voltage of the buffer is not instantaneously increased. Thus, the bootstrap capacitor connected between the first series circuit and the second series circuit can cause the electric potential in the first series circuit to be instantaneously increased to a sufficient degree. This brings about an effect that generates, with certainty, the output voltage not decreased in voltage by the degree of the threshold voltage.

In order to attain the object, a buffer according to the present invention includes a first buffer and a second buffer, wherein: the first buffer is the buffer as set forth in the above; and the second buffer has at least a configuration in which the output signal of the first buffer, instead of the input signal, is inputted to the gates of the two channel transistors forming the second series circuit in the first buffer.

With the invention, it is possible that two output voltages having respective phases opposite to each other be obtained. Under a requirement that the inverted signal generated in a panel be a signal great in a current drive but not causing an increase in a consumption current, the invention is configured such that an output of either one of the first buffer and the second buffer is used so as to operate the second series circuit of the other of the first buffer and the second buffer. This brings about an effect that successfully outputs the two output voltages.

In order to attain the object, a display device according to the present invention includes the buffer as set forth in the above description.

The invention brings about an effect that realizes the display device in which it is possible that a consumption current be reduced and a load be sufficiently driven.

In order to attain the object, the display device according to the present invention is configured such that an output circuit of a source driver includes the buffer.

The invention brings about an effect that realizes the display device including the source driver in which it is possible that the consumption current be reduced and the load be sufficiently driven.

In order to attain the object, the display device according to the present invention is configured such that an output circuit of a gate driver includes the buffer.

The invention brings about an effect that realizes the display device including the gate driver in which it is possible that the consumption current be reduced and the load be sufficiently driven.

In order to attain the object, the display device according to the present invention is configured such that an inverter includes the buffer, the inverter included in a circuit for generating a signal to be inputted to a source driver and a signal to be inputted to a gate driver.

The invention brings about an effect that realizes the display device including the inverter in which it is possible that the consumption current be reduced and the load be sufficiently driven.

In order to attain the object, the display device according to the present invention is configured such that a level shifter circuit includes the buffer, the level shifter circuit included in a circuit for generating a signal to be inputted to a source driver and a signal to be inputted to a gate driver.

The invention brings about an effect that realizes the display device including the level shifter circuit in which it is possible that the consumption current be reduced and the load be sufficiently driven.

For a fuller understanding of the nature and advantages of the invention, reference should be made to the ensuing detailed description taken in conjunction with the accompanying drawings.

BRIEF DESCRIPTION OF DRAWINGS

FIG. 1 is a circuit diagram showing a configuration of a first buffer in accordance with an embodiment of the present invention.

FIG. 2 is a circuit diagram showing a configuration of a second buffer in accordance with the embodiment of the present invention.

FIG. 6 is a circuit diagram showing how the second inverted-signal generating section operates in a second way.

FIG. 10 is a circuit diagram showing a configuration of a third buffer in accordance with the embodiment of the present invention.

FIG. 14 is a circuit diagram showing a configuration of a fourth buffer in accordance with the embodiment of the present invention.

FIG. 18 is a circuit diagram showing a configuration of a seventh buffer and how it operates in a first way, in accordance with a conventional art.

FIG. 19 is a circuit diagram showing a configuration of the first buffer and how it operates in a second way, in accordance with the conventional art.

FIG. 20 is a circuit diagram showing a configuration of the second buffer and how it operates in a first way, in accordance with the conventional art.

FIG. 27 is a circuit diagram showing how the second inverted-signal generating section shown in FIG. 25 operates in a second way.

FIG. 30 is a circuit diagram showing a configuration of an eight buffer in accordance with the embodiment of the present invention.

BRIEF DESCRIPTION OF REFERENCE NUMERALS

1, /1 transistor (first transistor)
2, /2 transistor (second transistor)
3, /3 transistor (third transistor)
21, 22, 23, 24, 25, 26, 27, 28 buffer
100, /100 capacitor (second capacitor)
101, /101 capacitor (first capacitor)
102, /102 capacitor
151 liquid crystal display device (display device)
A, AA, AB transistor (fourth transistor)
T resistor
Ta transistor (fifth transistor, diode-connected transistor) a through e, /a through /e transistor (first through fifth level-translating-section transistors)
103, /103 capacitor (first level-translating-section capacitor)
104, /104 capacitor (second level-translating-section capacitor)

DESCRIPTION OF EMBODIMENTS

One embodiment of the present invention is described as follows, with references to FIGS. 1 through 17 and 23 through 30.

Figure 17:
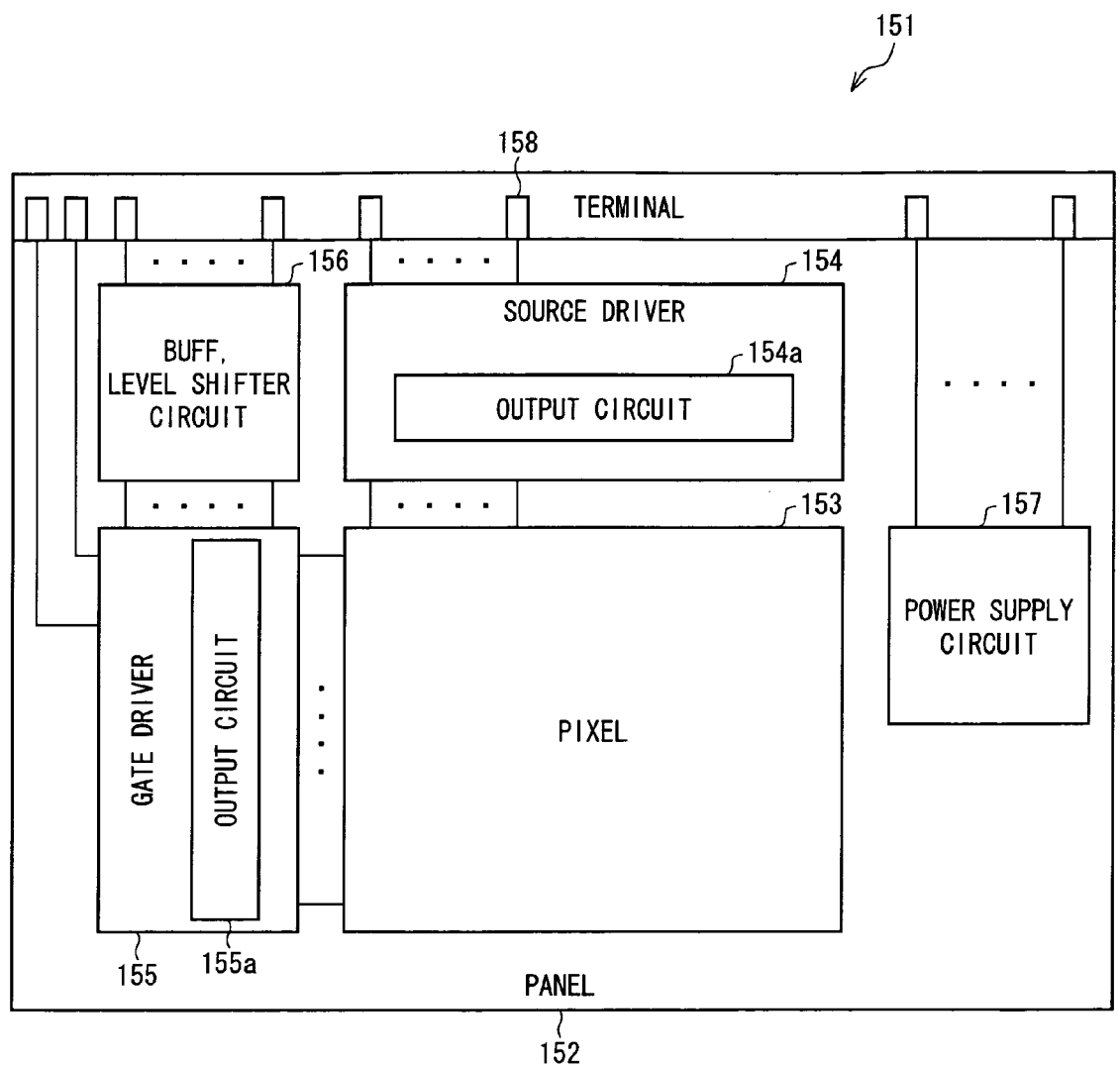
FIG. 17 is a block diagram showing a configuration of a display device in accordance with the embodiment of the present invention.
Figure 21:
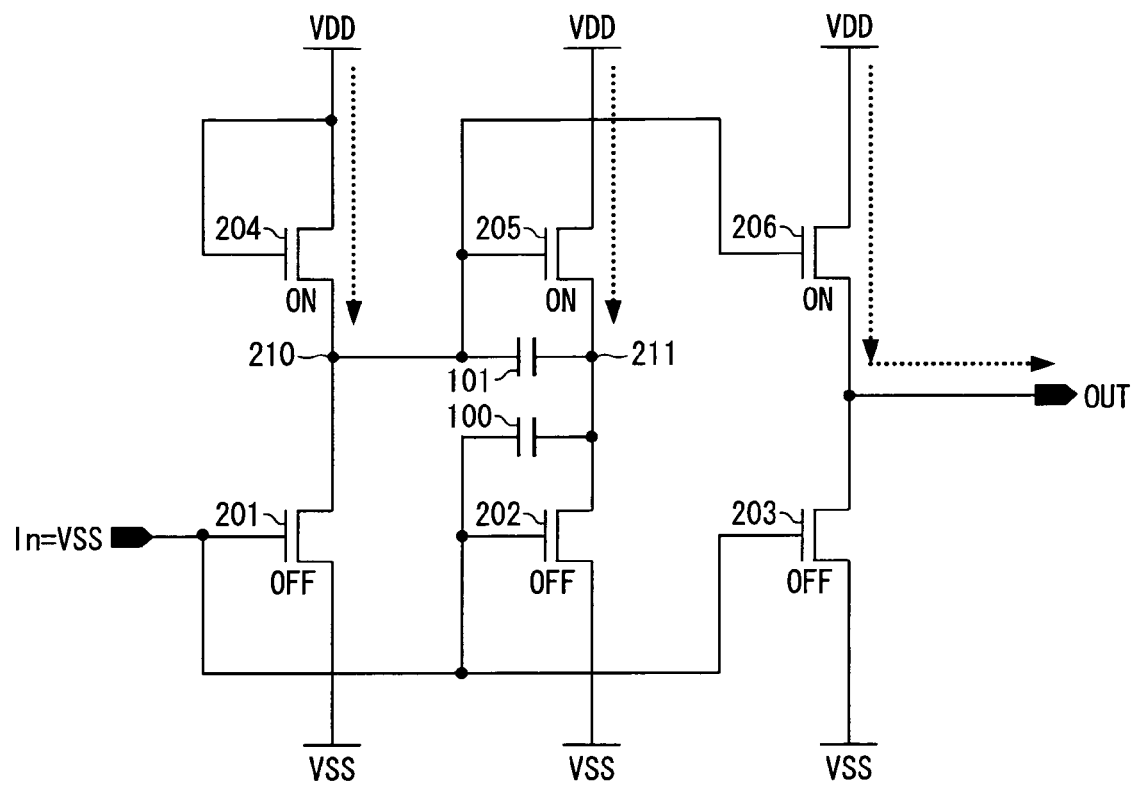
FIG. 21 is a circuit diagram showing the configuration of the second buffer and how it operates in a second way, in accordance with the conventional art.
Figure 22:
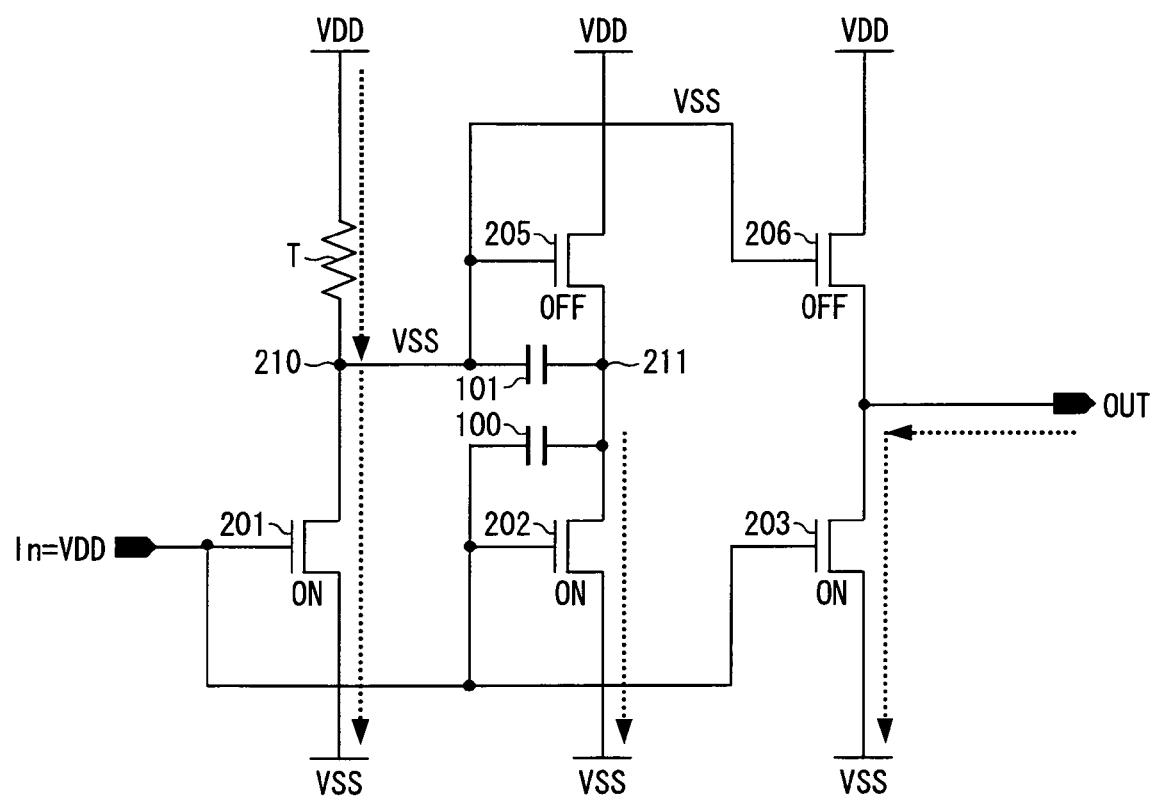
FIG. 22 is a circuit diagram showing a configuration of the third buffer and how it operates, in accordance with the conventional art.

FIG. 17 shows a configuration of a liquid crystal display device (display device) 151 in accordance with the present embodiment.

The liquid crystal display device 151 includes a panel 152 on which a pixel region 153 is formed, and includes, on the panel 152, a source driver 154, a gate driver 155, a BUFF/level shifter circuit 156, a power supply circuit 157, and terminals 158. The source driver 154 includes an output circuit 154a for outputting data signals for respective source bus lines of the pixel region 153. The gate driver 155 includes an output circuit 155a for outputting selection signals to respective gate bus lines so that the data signals from the source driver 154 are written down into corresponding pixels of the pixel region 153. The output circuits 154a and 155a are each formed by a buffer having a low output impedance, which serves an amplifier for receiving an input signal so as to generate a data signal with unity gain. The BUFF/level shifter circuit 156 includes a buffer, which has a low output impedance and serves as an amplifier, and supplies a signal processed in the buffer to the source driver 154 and the gate driver 155. The buffer in the BUFF/level shifter circuit 156 may be (i) a unity gain amplifier, such as an inverter, for performing a correction of a signal decay, (ii) a level shifter circuit for translating a source voltage of a signal, or (iii) the like. As described above, the buffer provides an impedance transformation for an input signal so as to generate an output signal. The power supply circuit 157 generates a voltage such as a reference voltage of a data signal, a common voltage, and a storage capacitance voltage. The terminals 158 serve to supply signals or power to the respective circuits provided on the panel 152.

The following describes a configuration of the buffer.

FIG. 1 shows a configuration of a buffer 21.

The buffer 21 includes an inverted-signal generating section 31 and a BUFF section 32. The buffer 21 is a single-phase input buffer including one input terminal INB, and includes transistors all of which have only a single type of channel polarity (in the present embodiment, n-channel transistors). The transistors having only the single type of channel polarity can be a TFT or a field-effect transistor formed on a silicon substrate.

The inverted-signal generating section 31 is a circuit for generating an inverted signal whose polarity is opposite to a signal inputted via the input terminal INB, i.e., an inverted signal whose polarity (High or Low) is invert to the signal inputted via the input terminal INB. The inverted-signal generating section 31 includes transistors 1 through 3 and a capacitor 100. With regard to the inverted signal, a signal level indicative of a level (High/Low) of a signal can be set to a predetermined signal level by setting source voltages in the inverted-signal generating section 31 to predetermined ones. A definition concerning the inverted signal is applicable to all cases described hereinafter in relation to inverted-signal generating sections. The capacitor (second capacitor) 100 is a bootstrap capacitor. Voltage sources in the inverted-signal generating section 31 consist of a High voltage source VDD and a Low voltage source VSS. The transistor 1 has a drain connected to VDD, a gate connected to the drain, and a source connected to one terminal of the capacitor 100. The transistor (second transistor) 2 has a drain connected to VDD, a gate connected to the source of the transistor 1, and a source connected to a drain of the transistor (third transistor) 3 and the other terminal of the capacitor 100. The transistor 3 has a source connected to VSS, and a gate connected to the input terminal INB. The transistors 2 and 3 are connected to each other at an output terminal 11 of the inverted-signal generating section 31.

The BUFF section (buffer section) 32 includes transistor 4 through 7 and capacitors 101 and 102. The capacitor (first capacitor) 101 is a bootstrap capacitor. The BUFF section 32 includes an output section having a low output impedance, and serves as a circuit for providing an impedance transformation for the signal inputted via the input terminal INB. The BUFF section 32 includes voltage sources consisting of a High voltage source VDD and a Low voltage source VSS. The transistor 4 has a drain connected to VDD, and a gate connected to the output terminal 11 of the inverted-signal generating section 31. The transistor 6 has a drain connected to a source of the transistor 4, a gate connected to the input terminal INB, and a source connected to VSS. The transistor 5 has a drain connected to VDD, and a gate connected to the source of the transistor 4 at a point 12. The transistor 7 has a drain connected to a source of the transistor 5, a gate connected to the input terminal INB, and a source connected to VSS. The capacitor 101 is connected between the respective sources of the transistors 4 and 5. The transistors 5 and 7 are connected to each other at a connection point which serves as an output terminal OUT of the BUFF section 32. The capacitor 102 is connected between the output terminal OUT and VSS.

According to the configuration, the transistors 4 and 6 are connected to each other in series so as to form a first series circuit, and the transistors 5 and 7 are connected to each other in series so as to form a second series circuit.

The capacitors 100 and 101 can be a parasitic capacitance, and the capacitor 102 can also be a parasitic capacitance.

In a case where the capacitors 100 and 101 are the parasitic capacitance, the following is preferably met.

In the cases with FIGS. 1 and 2, if the capacitor 101 is the parasitic capacitance, the BUFF section 32 should be designed such that:

$$VDD-(\text{threshold voltage } Vth \text{ of the transistor } 4+\Delta V)$$
$$>VDD+(\text{threshold voltage of the transistor } 5) \quad (1);$$

where, $\Delta V=(Cg/(Ca+Cg))\times V$: voltage at the point 12 which is instantaneously increased, Ca=(parasitic capacitance of the transistor 4)+(parasitic capacitance of the transistor 6)+(capacitance of the line connected between (i) the gate of the transistor 5 and (ii) the source of the transistor 4 and the drain of the transistor 6), Cg=(capacitance of the transistor 5 being turned ON (=gate capacitance of the transistor 5 to the source and the drain of the transistor 5), and V=VDD−VSS: an amount by which electric potential at the source of the transistor 5 is instantaneously increased.

In a case where the inequation (1) is met by Cg alone, the parasitic capacitance can sufficiently serve in place of the capacitor 101 by itself. However, in a case where the inequation (1) is not met by Cg alone, the following measure should be taken so that the inequation (1) is met with certainty, the measure including additionally providing a bootstrap capacitor so as to form the capacitor 101.

In the case with FIG. 1, if the capacitor 100 is the parasitic capacitance, the inverted-signal generating section 31 should be designed such that:

$$VDD-(\text{threshold voltage } Vth \text{ of the transistor } 1+\Delta V)$$
$$>VDD+(\text{threshold voltage of the transistor } 2) \quad (2);$$

where, $\Delta V=(Cg/(Ca+Cg))\times V$: voltage at the point 10 which is instantaneously increased, Ca=(parasitic capacitance of the transistor 1)+(capacitance of the line connected between the gate of the transistor 2 and the source of the transistor 1), Cg=(capacitance of the transistor 2 being turned ON (=gate capacitance of the transistor 2 to the source and the drain of the capacitor 2), and V=VDD−VSS: an amount by which an electric potential at the point 11 is instantaneously increased.

In a case where the inequation (2) is met by cg alone, the parasitic capacitance can sufficiently serve in place of the capacitor 100 by itself. However, in a case where the inequation (2) is not met by Cg alone, the following measure should be taken so that the inequation (2) is met with certainty, the measure including additionally providing a bootstrap capacitor so as to form the capacitor 101.

FIG. 2 shows a configuration of a buffer 22.

The buffer 22 includes an inverted-signal generating section 33 and a BUFF section 32. The buffer 22 is a single-phase input buffer including one input terminal INB, and includes transistors all of which have only a single type of channel polarity (in the present embodiment, n-channel transistors). The BUFF section 32 is identical with the BUFF section 32 of the buffer 21.

The inverted-signal generating section 33 includes a transistor A and a resistor T. The inverted-signal generating section includes voltage sources consisting of a High voltage source VDD and a Low voltage source VSS. The resistor T is a resistor having a high resistance value, and has one end connected to VDD. The transistor (fourth transistor) A has a drain connected to the other end of the resistor T in series at a point Z, a gate connected to the input terminal INB, and a source connected to VSS. The point Z at which the resistor T and the transistor A are connected to each other in series serves as an output terminal of the inverted-signal generating section 33.

The following describes how the circuits in the buffer 21 and those in the buffer 22 operate.

Figure 3:
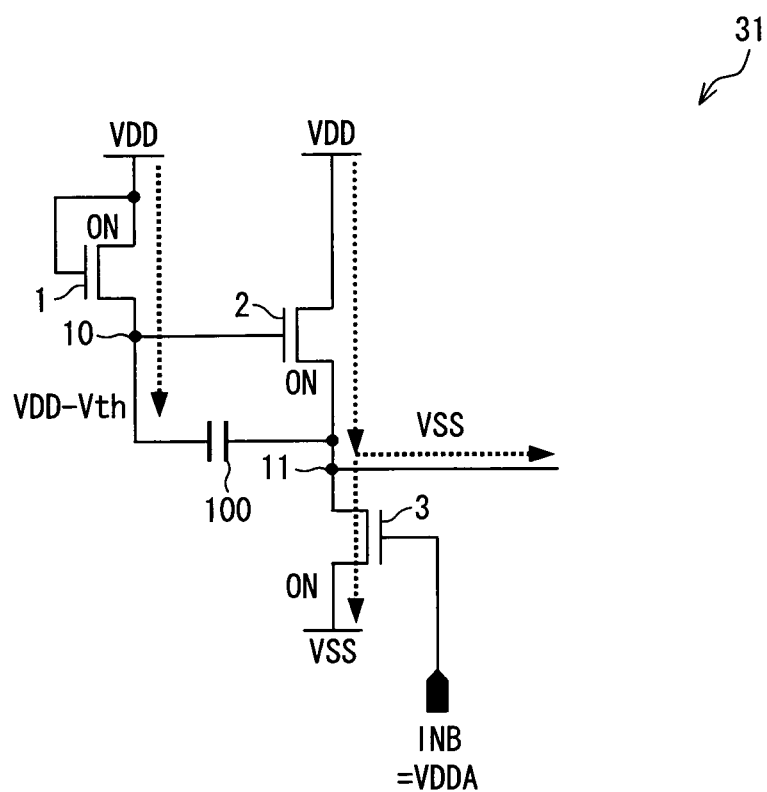
FIG. 3 is a circuit diagram showing how a first inverted-signal generating section operates in a first way.
Figure 4:
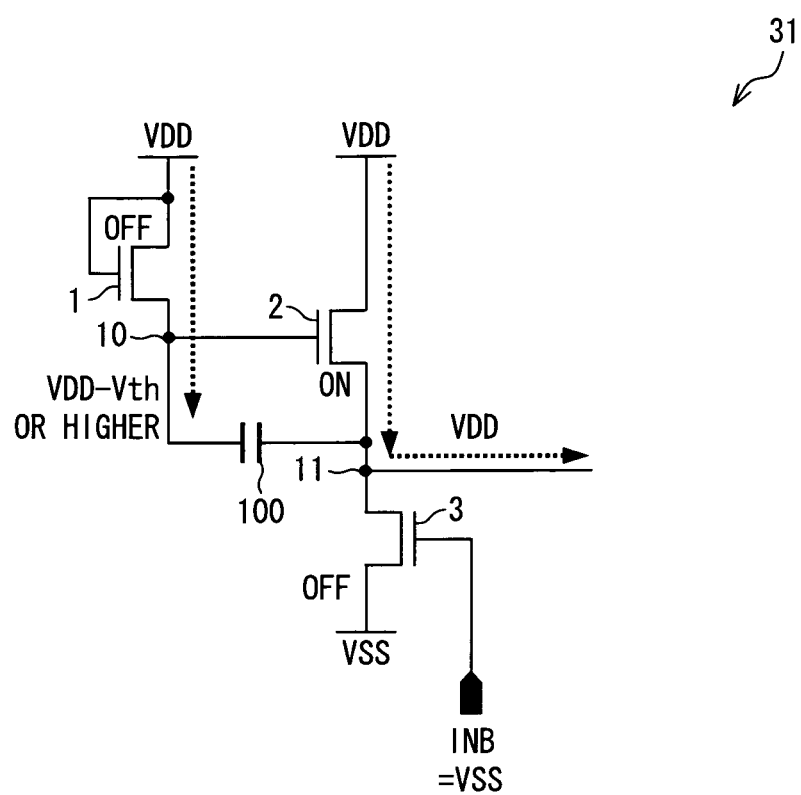
FIG. 4 is a circuit diagram showing how the first inverted-signal generating section operates in a second way.

FIGS. 3 and 4 each show how the inverted-signal generating section 31 of the buffer 21 operates.

Figure 23:
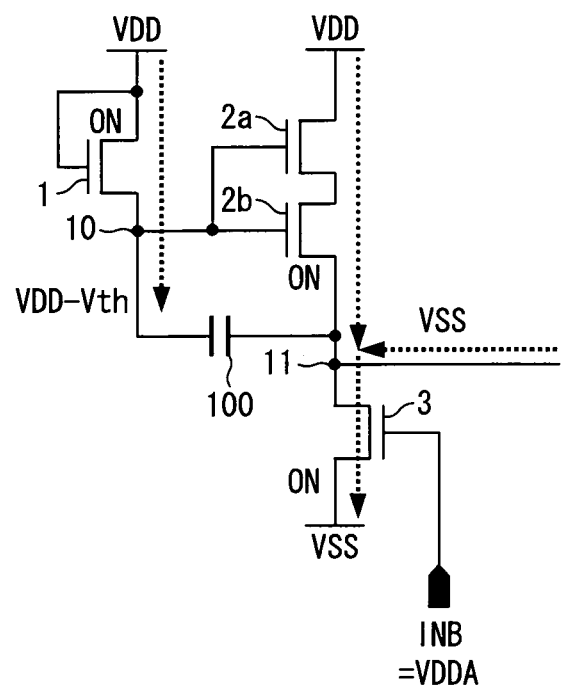
FIG. 23 is a circuit diagram showing a configuration of a modified example of the first inverted-signal generating section included in the first buffer.

As shown in FIG. 3, in a case where the input terminal INB receives a High voltage VDD of an input signal, the transistor 3 is turned ON since it is designed such that VDDA−VSS is equal to the threshold voltage Vth of the transistor 3 or higher. The transistor 1 has a gate connected to VDD. Since the capacitor 100 is provided, a decrease in an electric potential at the point 11 leads to a decrease in an electric potential at the point 10. The transistor 1 is turned ON at a time when the electric potential at the point 10 is decreased to be equal to the threshold voltage Vth of the transistor 1 or lower. By this, a drain current from VDD flows into the transistor 1, and consequently, the electric potential at the point 10 is increased. Then, the transistor 1 is turned OFF at a time when the electric potential at the point 10 is increased to be "VDD−threshold voltage Vth of the transistor 1". Thus, the electric potential at the point 10 is caused to be "VDD−threshold voltage Vth of the transistor 1" at the last. The transistor 2 is turned ON, since it has a gate receiving the electric potential of "VDD−threshold voltage Vth of the transistor 1" and the electric potential at the point 11 is VSS. The transistors 2 and 3 are turned ON in the way, thereby causing a pass-through current passing through the transistors 2 and 3 to be generated. In this condition, if it is configured such that the transistor 2 has a reduced current drive, it is possible that a consumption current be reduced. The current drive for the transistor 2 may be reduced by forming the transistor 2, as shown in FIG. 23, so as to provide a high resistance value of a current path. Specifically, the transistor 2 is formed by a plurality of identical channel transistors (such as transistors 2a and 2b) that are stacked in line, i.e., connected to each other in cascade. With the transistor 2 configured in the way, it is possible that the pass-through current be prevented. In the above configuration, gates of the identical channel transistors stacked in line are preferably connected to the point 10, as shown in FIG. 23. The transistors 2a and 2b form a second transistor group.

As shown in FIG. 4, in a case where the input terminal INB receives a Low voltage VSS of the input signal, the transistor 3 is turned OFF. Thus, the electric potential at the point 11 is increased to be "VDD−threshold voltage Vth of the transistor 2". The electric potential at the point 10 is "VDD−threshold voltage Vth of the transistor 1", and the transistor 1 is turned OFF. In this condition, if the electric potential at the point 11 is increased, the capacitor 100 causes the electric potential at the point 10 to be instantaneously increased. In consideration, by designing such that the electric potential at the point 10 is instantaneously increased from "VDD−threshold voltage Vth of the transistor 1" to "VDD+threshold voltage Vth of the transistor 2" or higher, it is possible to cause the electric potential at the point 11 to be outputted as VDD which is not decreased in voltage by the degree of the threshold voltage Vth.

Figure 5:
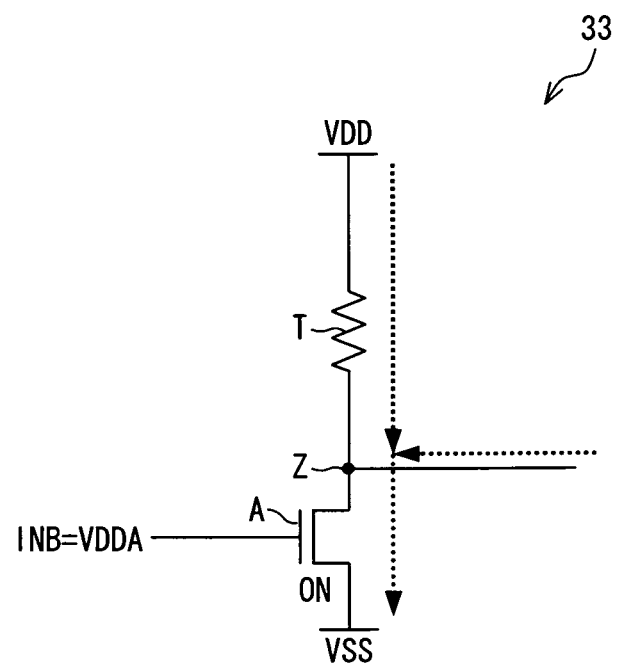
FIG. 5 is a circuit diagram showing how a second inverted-signal generating section operates in a first way.

FIGS. 5 and 6 show how the inverted-signal generating section 33 of the buffer 22 operates.

As shown in FIG. 5, in a case where the input terminal INB receives VDDA, a transistor A is turned ON. Consequently, an electric potential at a point Z is caused to be VSS. In this case, a pass-through current is generated. However, since the inverted-signal generating section 33 includes a resistor T having a high resistance value, it is possible that the pass-through current be prevented.

As shown in FIG. 6, in a case where the input terminal INB receives VSS, the transistor A is turned OFF. Thus, a current flows to the BUFF section 32 from the resistor T via the point Z. Since the current is so small, an electric potential at the point Z is caused to be VDD.

According to the inverted-signal generating section 33, as discussed above, one of the transistors is replaced by the resistor T. As such, the inverted-signal generating section 33 can have a circuit reduced in a layout area.

Figure 24:
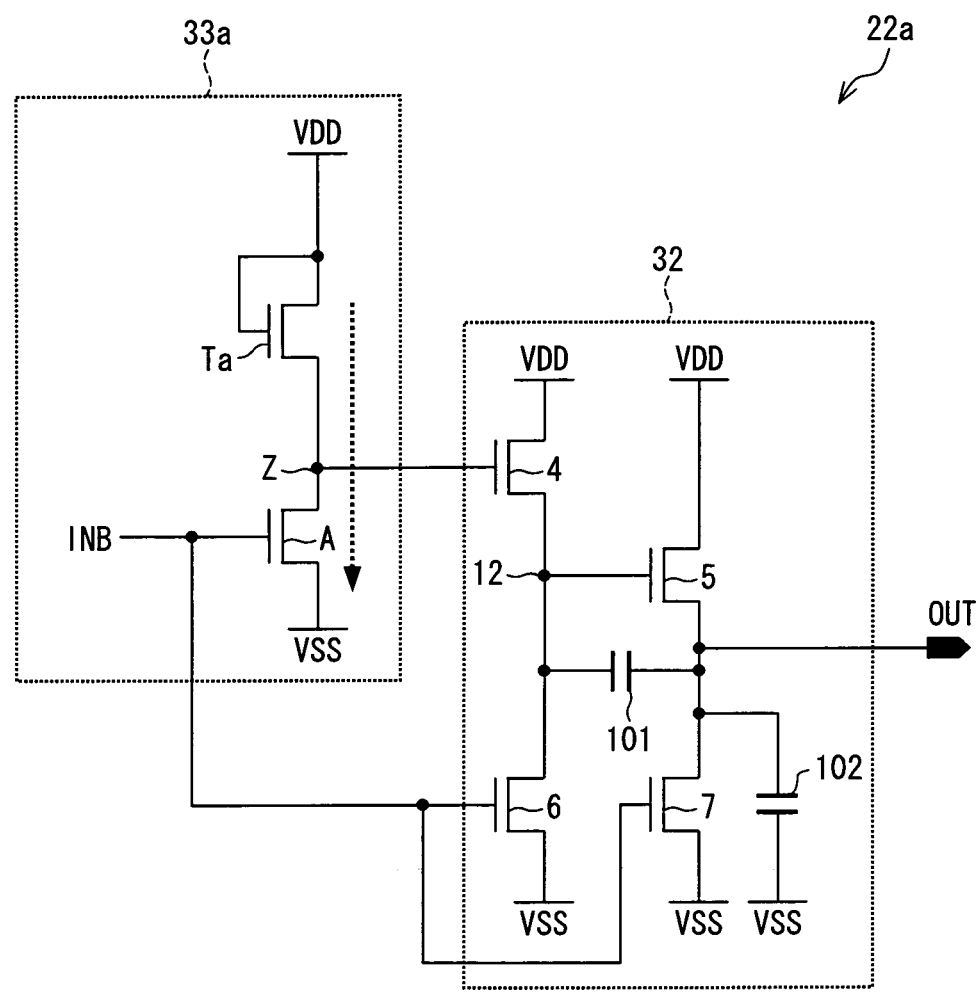
FIG. 24 is a circuit diagram showing a configuration of the second buffer, which includes the second inverted-signal generating section in which a resistor is replaced with a transistor.

FIG. 24 shows a configuration of a buffer 22a.

The buffer 22a includes an inverted-signal generating section 33a and a BUFF section 32. The inverted-signal generating section 33a includes a transistor (fifth transistor) Ta, instead of the resistor T in the inverted-signal generating section 33 of the buffer 22. The transistor Ta is an n-channel transistor, and has a drain connected to VDD and a source connected to the drain of the transistor A at a point Z. Further, the transistor Ta is a diode-connected transistor whose gate and drain are connected to each other. The BUFF section 32 is identical with the BUFF section 32 of the buffer 21.

Figure 25:
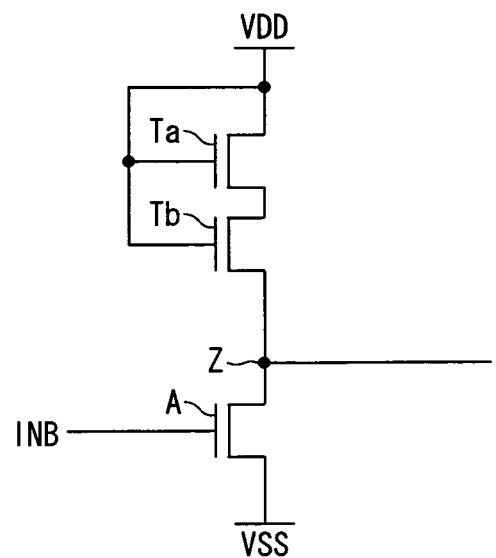
FIG. 25 is a circuit diagram showing a configuration of a modified example of the second inverted-signal generating section shown in FIG. 24.

In the inverted-signal generating section 33a in which the transistor Ta is the diode-connected transistor, a pass-through current is generated. It is possible that the pass-through current be prevented by additionally providing a transistor (such as transistor Tb) having the same channel polarity as the transistor Ta in such a manner that the transistors Ta and Tb are stacked in line, i.e., connected to each other in cascade, as shown in FIG. 25. The number of transistors stacked in line is not limited to 2, but generally can be any plural number. According to a configuration shown in FIG. 25, the transistor Tb has a gate connected to that of the transistor Ta such that the transistor Tb receives VDD via the gate. Also, the transistor Tb has a drain connected to a source of the transistor Ta, and a source connected to a drain of a transistor A at the point Z. The transistors Ta and Tb form a fifth transistor group.

Figure 26:
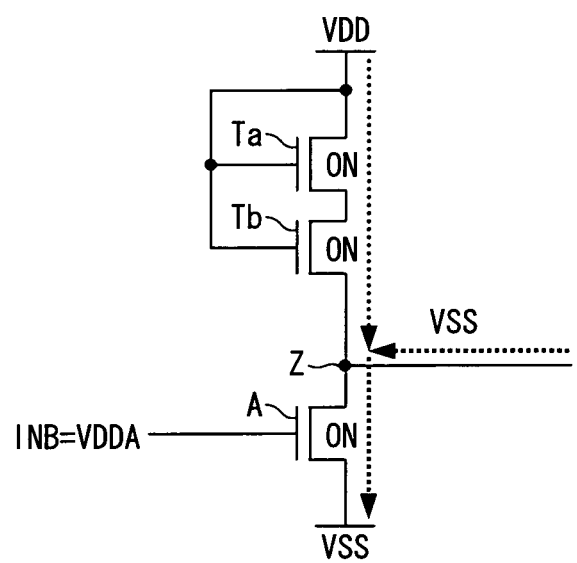
FIG. 26 is a circuit diagram showing how the second inverted-signal generating section shown in FIG. 25 operates in a first way.

FIGS. 26 and 27 show how the inverted-signal generating section 33a shown in FIG. 25 operates.

As shown in FIG. 26, in a case where an input terminal INB receives VSSA, the transistor A is turned ON so that an electric potential at the point Z is caused to be VSS. This causes a pass-through current to be generated on a current path. However, it is possible that the pass-through current be reduced since the current path formed by the transistors Ta and Tb stacked in line has a greater resistance value.

As shown in FIG. 27, in a case where the input terminal INB receives VSS, the transistor A is turned OFF. Thus, a current passing through the transistors Ta and Tb flows to the BUFF section 32 via the point Z. This causes the electric potential at the point Z to be outputted as "VDD−threshold voltage Vth". The BUFF section 32, which follows the inverted-signal generation section 33a, can be designed by taking into account a decrease of an output in voltage by the degree of "VDD−threshold voltage Vth".

According to the buffer including the inverted-signal generating section 33a shown in FIG. 24 or 25, the inverted-signal generating section 33a includes the diode-connected transistor. As such, the inverted-signal generating section 33a has to include no capacitor, unlike in the case with the inverted-signal generating section 31. Thus, the inverted-signal generating section 33a can have a layout area that is reduced accordingly to a removal of the capacitor.

Figure 7:
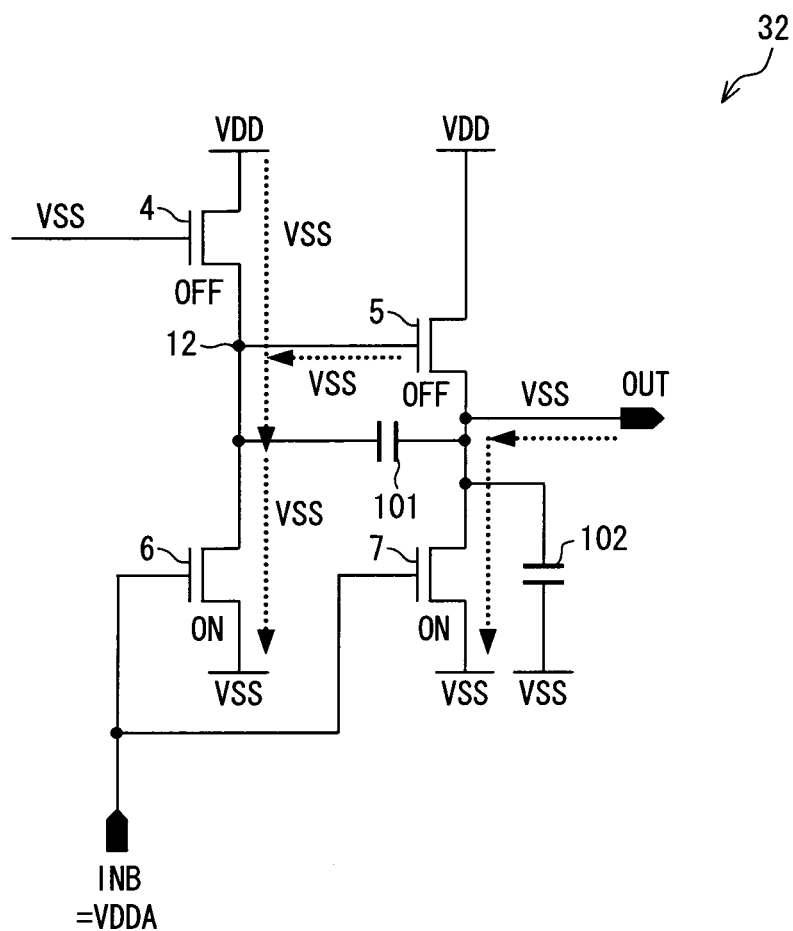
FIG. 7 is a circuit diagram showing how a buffer section operates in a first way.
Figure 8:
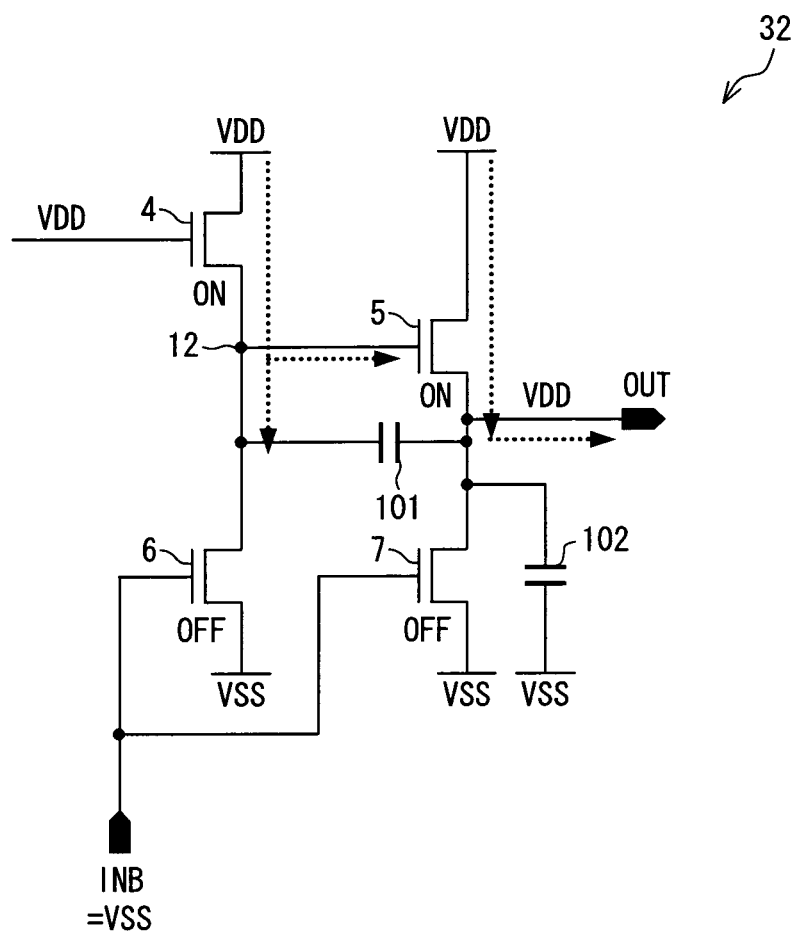
FIG. 8 is a circuit diagram showing how the buffer section operates in a second way.

FIGS. 7 and 8 show how the BUFF section 32 of the buffer 21 or 22 operates.

As shown in FIG. 7, in a case where the input terminal INB receives VDDA, the transistors 6 and 7 are turned ON since it is designed such that "VDDA−VSS" is equal to the threshold voltage Vth of the transistors 6 and 7 or higher. The transistor 4, on the other hand, is turned OFF since it has the gate receiving VSS from the point 11 of the inverted-signal generating section 31 or the point Z of the inverted-signal generating section 33. By the above, an electric potential at the point 12 is caused to be VSS. The transistor 5 is turned OFF since it has the gate receiving VSS. Thus, VSS is outputted to the output terminal OUT.

As shown in FIG. 8, in a case where the input terminal INB receives VSS, the transistors 6 and 7 are turned OFF. The transistor 4 has a gate receiving the voltage VDD from the point 11 of the inverted-signal generating section 31 or the point Z of the inverted-signal generating section 33. Since it is set such that "VDD−VSS" is equal to the threshold voltage Vth of the transistor 4 or higher, the transistor 4 is turned ON. This causes the electric potential at the point 12 to be increased from VSS to "VDD−threshold voltage Vth of the transistor 4". Thus, the transistor 5, which has a gate receiving "VDD−threshold voltage Vth of the transistor 4", is turned ON. Consequently, an electric potential at the output terminal OUT is gradually increased to "VDD−threshold voltage Vth of the transistor 5". Then, the transistor 4 is turned OFF at a time when the electric potential at the point 12 reaches "VDD−threshold voltage Vth of the transistor 4". In this condition, if the electric potential at the output terminal OUT is increased, the capacitor 101 causes the electric potential at the point 12 to be instantaneously increased. In consideration, by designing such that the electric potential at the point 12 is instantaneously increased from "VDD−threshold voltage Vth of the transistor 4" to "VDD+threshold voltage Vth of the transistor 5" or higher, it is possible to output, to the output terminal OUT, VDD which is not decreased in voltage by the degree of the threshold voltage.

Figure 9:
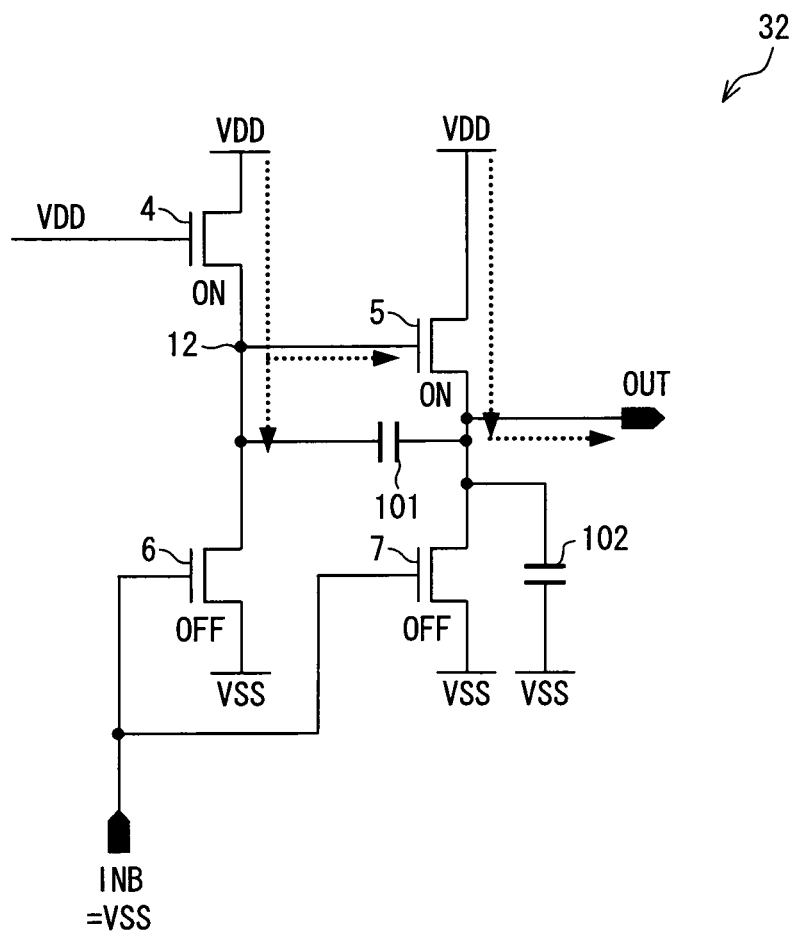
FIG. 9 is a circuit diagram explaining a configuration of the buffer section in detail.

FIG. 9 shows how the capacitor 102 of the BUFF section 32 functions.

The BUFF section includes the capacitor 102 such that even when the transistors 5 is turned ON, it takes longer before an electric potential at the output terminal OUT is increased from VSS to VDD. This makes it possible that the electric potential at the point 12, which is increased by turning ON the transistor 4, reach "VDD−threshold voltage Vth of the transistor 4" before the transistor 4 is turned OFF. The electric potential at the point 12 cannot be instantaneously increased to a sufficient degree by the capacitor 102, in a case where the electric potential at the output terminal OUT is increased, due to the transistor 5 being turned ON, closer to VDD before the transistor 4 is turned OFF. This may cause an output to the output terminal OUT to be decreased in voltage from VDD by the degree of the threshold voltage Vth. In order that such decrease of the output is prevented, the capacitor 102 is provided as described above. Since the capacitor 102 is provided, it takes longer before the electric potential at the output terminal OUT is increased to VDD so that bootstrapping can be performed with certainty.

FIG. 10 shows a configuration of another buffer 23.

The buffer 23 includes an inverted-signal generating section 31, an inverted-signal generating section 34, and a BUFF section 32. Both the inverted-signal generating section and the BUFF section 32 are identical with their counterparts described in relation to the buffer 21 or 22, or identical with their counterparts included in other buffers to be described in accordance with the present embodiment. The buffers 21 and 22 described with reference to respective FIGS. 1 and 2 perform a level shift on an input signal having a VDDA or VSS level so as to generate an output having a VSS or VDD level. In the cases with the buffer 21 and 22, however, if an input signal having a VSSA level higher than a VSS level is inputted, the transistors 3, 6, and 7 cannot be turned OFF. In contrast, in the case with the buffer 23, the inverted-signal generating section 34 performs a level shift such that the input signal having the VSSA level is outputted as an output having a VSS level.

The inverted-signal generating section (input-signal level translating section) 34 includes a transistor (first level-translating-section transistor) a, a transistor (second level-translating-section transistor) b, a transistor (third level-translating-section transistor) c, a transistor (fourth level-translating-section transistor) d, a transistor (fifth level-translating-section transistor) e, a capacitor (first level-translating-section capacitor) 103, and a capacitor (second level-translating-section capacitor) 104. The capacitor 103 is a bootstrap capacitor. The inverted-signal generating section 32 includes voltage sources consisting of a High voltage source VDD and a Low voltage source VSSA. The transistor a has a drain connected to VDD, a gate connected to the drain, and a source connected to one terminal of the capacitor 103. The transistor b has a drain connected to VDD, a gate connected to the source of the transistor a, and a source connected to a drain of the transistor c and the other terminal of the capacitor 103. The transistor c has a source connected to VSSA, and a gate connected to an input terminal IN. The capacitor 104 has one terminal connected to a point 14 at which the transistors b and c are connected to each other. The transistor d has a drain connected to a gate thereof and the other terminal of the capacitor 104, and a source connected to VSSA. The transistor e has a drain connected to the other terminal of the capacitor 104, a gate connected to a terminal INIT, and a source connected to VSSA. The transistors d and e and the other terminal of the capacitor are connected to one another at a point 15, which serves as an output terminal of the inverted-signal generating section 34.

Figure 11:
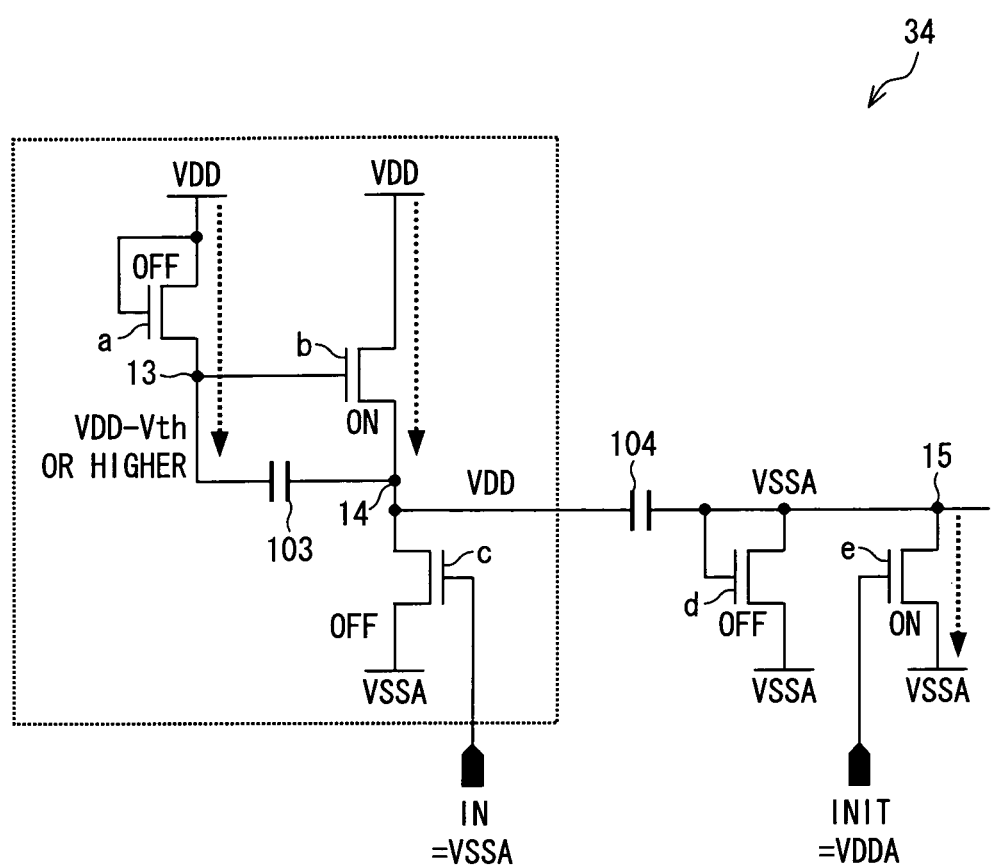
FIG. 11 is a circuit diagram showing how an input-signal level translating section operates in a first way.
Figure 12:
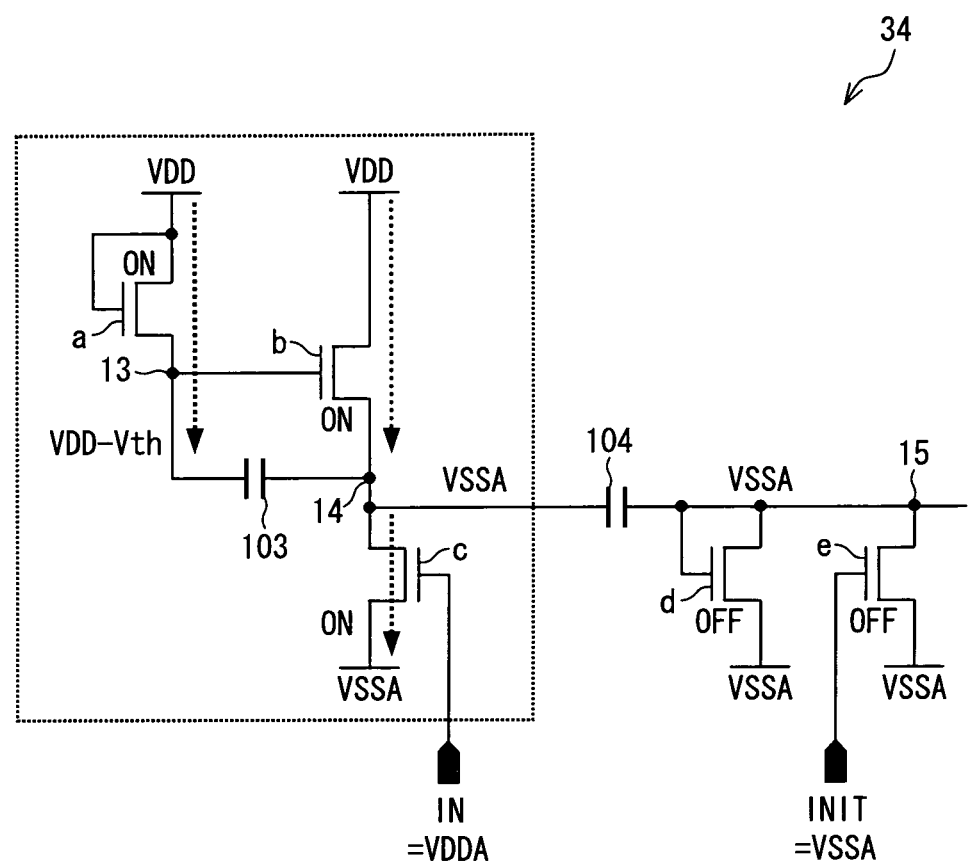
FIG. 12 is a circuit diagram showing how the input-signal level translating section operates in a second way.
Figure 13:
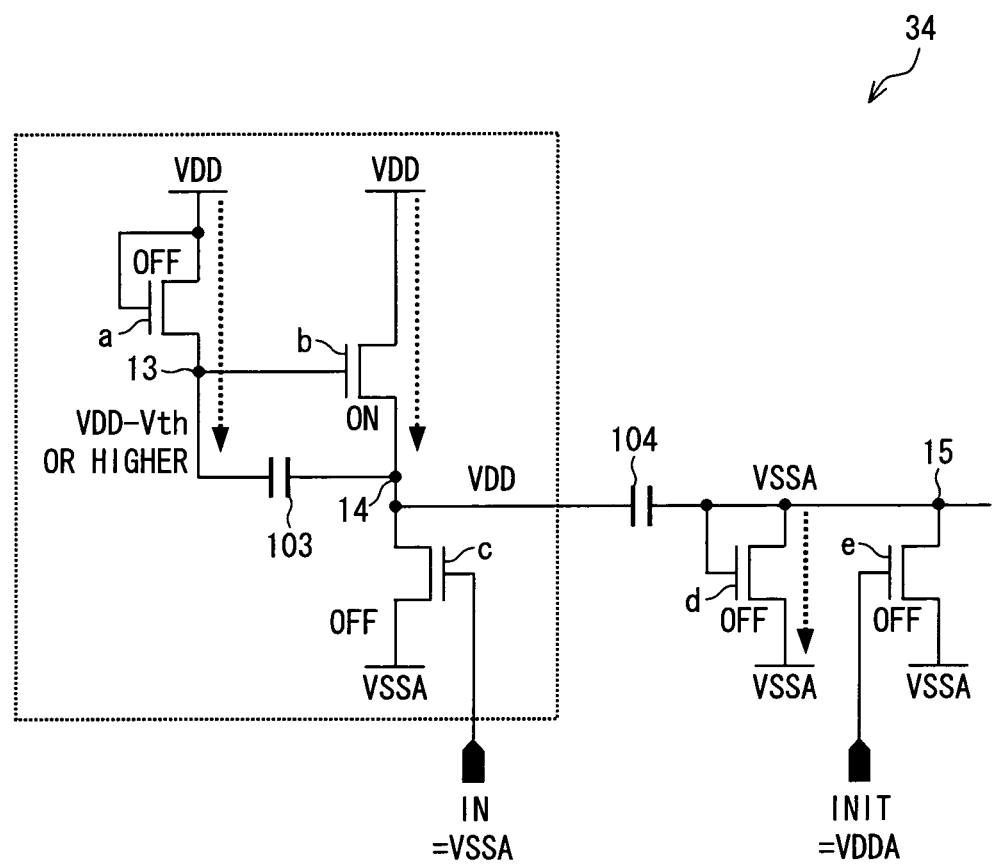
FIG. 13 is a circuit diagram showing how the input-signal level translating section operates in a third way.

FIGS. 11 through 13 show how the inverted-signal generating section 34 operates.

As shown in FIG. 11, the inverted-signal generating section 34 performs an initialization process. According to the initialization process, the terminal INIT first receives VDDA. This causes the transistor e to be tuned OFF so that an electric potential at a point 15 is caused to be VSSA. VSSA is inputted to the gate of the transistor d so that the transistor d is turned OFF. In FIG. 11, a circuit outlined by a dashed line is identical with the inverted-signal generating section 31 in terms of a configuration, except that the transistor c has the gate receiving VSSA from the input terminal IN.

As shown in FIG. 12, subsequently, the terminal INIT receives VSSA so that the transistor e is turned OFF. In this case, the same operation as performed in the case with FIG. 3 is performed. As such, an electric potential at a point 14 is instantaneously decreased from VDD to VSSA. Thus, the capacitor 104 causes the electric potential at the point 15 to be instantaneously decreased from VSSA. By designing such that the electric potential at the point 15 is instantaneously decreased to be lower than VSS, it is possible to cause the transistors 3, 6, and 7 to be turned OFF with certainty.

As shown in FIG. 13, in a case where the input terminal IN receives VSSA and the terminal INIT receives, as in the case with FIG. 12, VSSA, the same operation as performed in the case with FIG. 4 is performed. Thus, the electric potential at the point 14 is instantaneously increased from VSSA to VDD. As such, the capacitor 104 causes the electric potential at the point 15 to be instantaneously increased from VSSA. Note, however, that it is controlled so that the electric potential at the point 15 is kept lower than "VSSA+threshold voltage Vth of the transistor d", because if the electric potential at the point 15 is increased to "VSSA+threshold voltage Vth of the transistor d" or higher, the transistor d is turned ON. In consideration, it is configured such that in a case where the input terminal IN receives VDDA, as shown in FIG. 12, the capacitor 104 causes the electric potential at the point 15 to be instantaneously decreased to be VSS or lower with certainty.

All the buffers described so far include n-channel transistors but no p-channel transistors. However, the present invention can alternatively be configured such that a buffer is formed by using p-channel transistors, as shown in FIGS. 14 and 15.

A buffer 24 shown in FIG. 24 includes an inverted-signal generating section 35 and a BUFF section 36. According to the buffer 24, transistors have a p-channel polarity opposite to the n-channel polarity of the transistors in the buffer 21. In FIG. 14, members corresponding to the members of the buffer 21 are given corresponding but slashed reference numerals. The buffer 24 includes voltage sources consisting of a High voltage source VDDA and a Low voltage source VSS.

Figure 15:
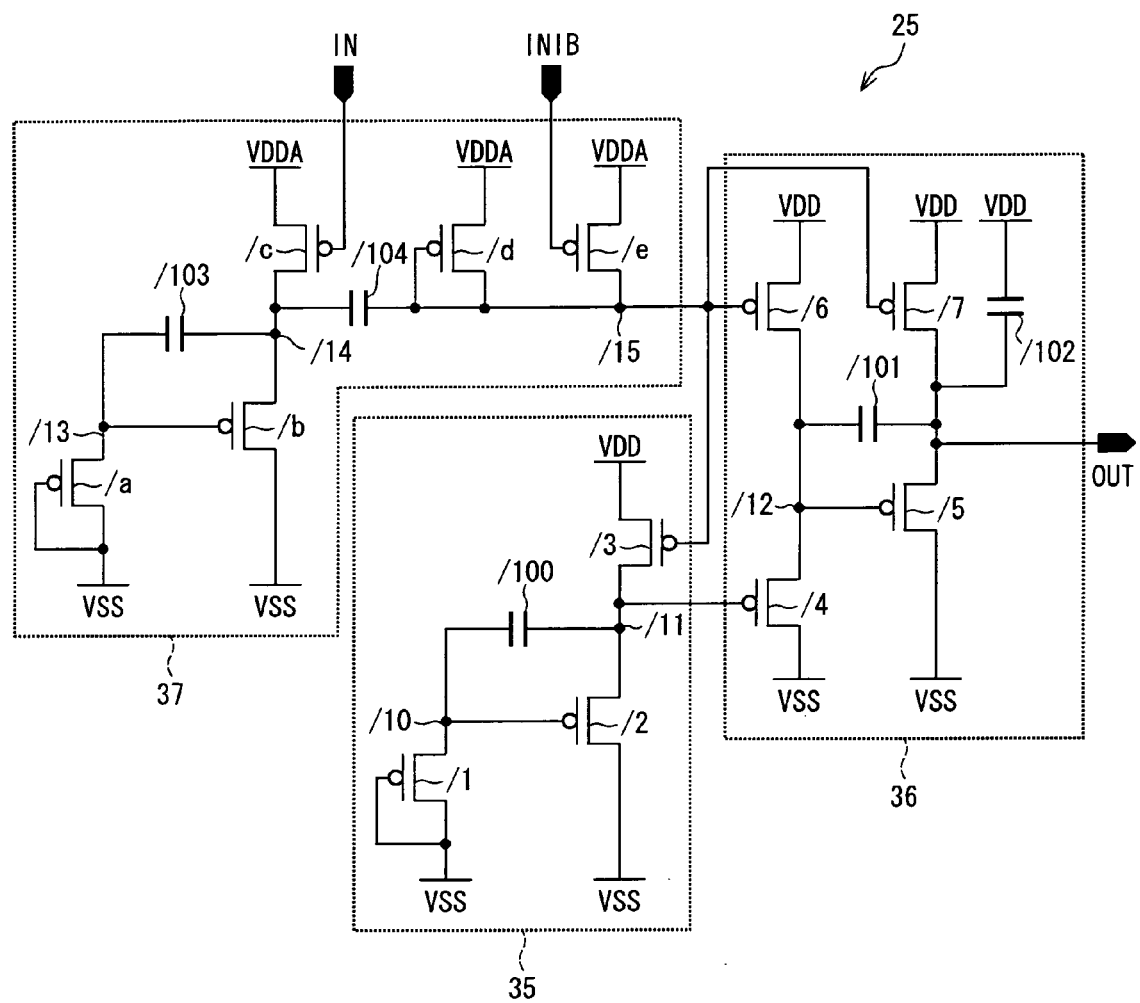
FIG. 15 is a circuit diagram showing a configuration of a fifth buffer in accordance with the embodiment of the present invention.

A buffer 25 shown in FIG. 15 includes inverted-signal generating sections 35 and 37 and a BUFF section 36. According to the buffer 25, transistors have a p-channel polarity opposite to the n-channel polarity of the transistors in the buffer 23. In FIG. 15, members corresponding to the members in the buffer 23 are given corresponding but slashed reference numerals. Both the inverted-signal generating section 35 and the BUFF section 36 have voltage sources consisting of a High voltage source VDD and a Low voltage source VSS. The inverted-signal generating section 37 includes voltage sources consisting of a High voltage source VDDA and a Low voltage source VSS.

The present invention is not limited to the cases discussed above. Alternatively, the present invention can be configured such that all the buffers discussed so far are formed by using either n-channel transistors or p-channel transistors.

Figure 16:
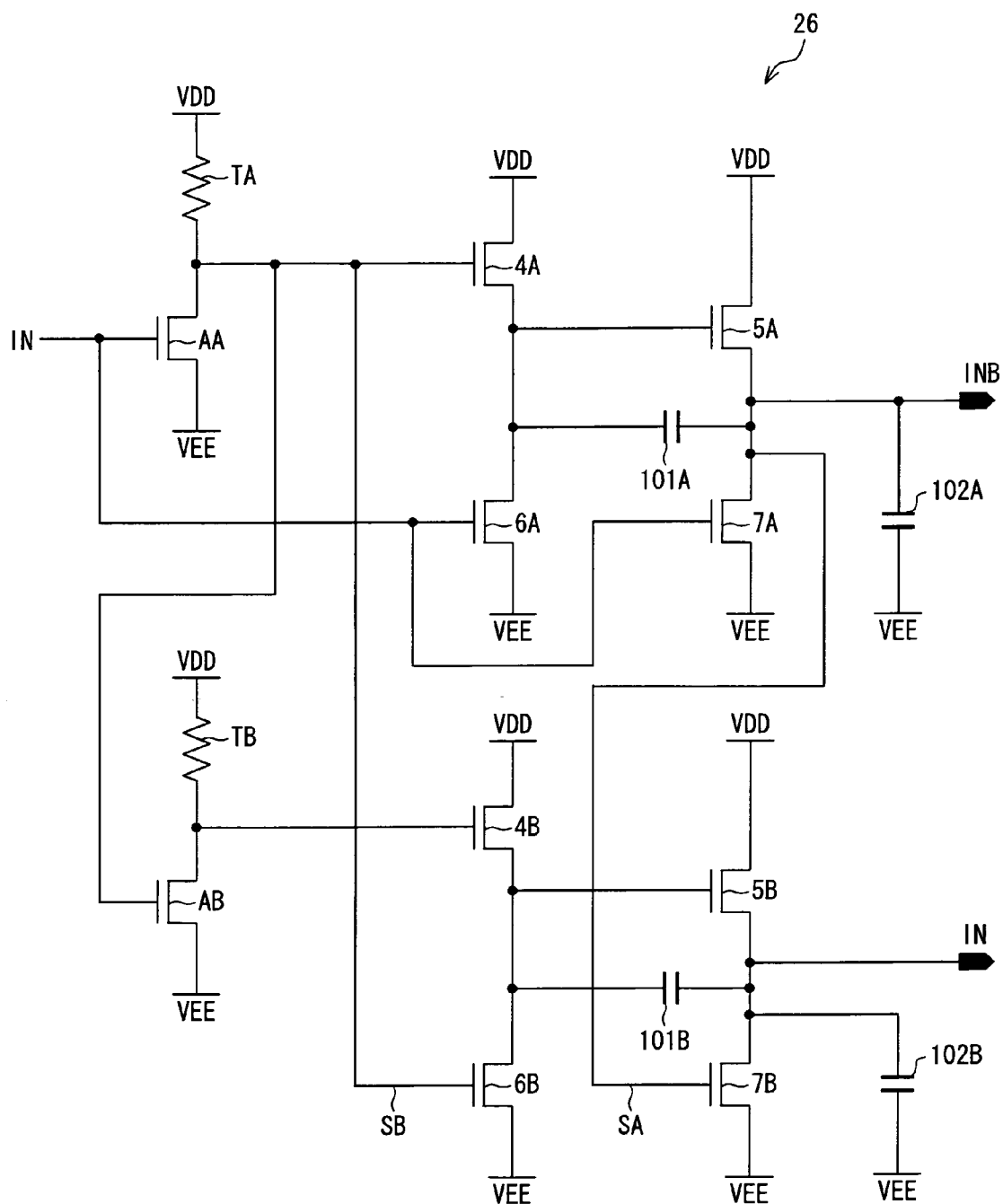
FIG. 16 is a circuit diagram showing a configuration of a sixth buffer in accordance with the embodiment of the present invention.

FIG. 16 shows a configuration of a buffer 26 which outputs two signals having respective phases opposite to each other.

The buffer 26 includes two lines of buffers, which are an A-line buffer (first buffer) and a B-line buffer (second buffer). The A-line buffer performs a level shift on a signal inputted via an input terminal IN, so as to output a signal via an output terminal OUT. The B-line buffer performs a level shift on the signal inputted via the input terminal IN, so as to output a signal via an output terminal IN. Both the A-line buffer and the B-line buffer are configured in basically the same way as the buffer 22. As such, in the A-line buffer, members corresponding to the members of the buffer 22 are given corresponding reference numerals added with A, and in the B-line buffer, members corresponding to the members of the buffer 22 are given corresponding reference numerals added with B. Note that the B-line buffer differs from the buffer 22 in that (i) transistors AB and 6B have respective gates each connected to a connection point at which a resistor A and a transistor AA are connected to each other, and (ii) a transistor 7B has a gate connected to a connection point at which transistors 5A and 7A are connected to each other. The B-line buffer configured in the way brings about an effect described as follows.

It is required that the transistor 7B be operated by a great current drive. In terms of a current drive, however, a signal SB for operating the transistor 6B is insufficient for operating the transistor 7B. This is because a resistor TA having a high resistance value is employed so that a pass-through current can be prevented. In view of such circumstances, it is configured such that a signal SA, which is greater in a current drive and supplied via the connection point at which the transistors 5A and 7A are connected to each other, is used so as to operate the transistor 7B. Thus, it is possible that the transistor 7B, operation of which requires a great current drive, be quickly operated. This in turn makes it possible that an electric potential at the output terminal IN is quickly changed down to VEE.

The buffer 26 shown in FIG. 16 can be modified in terms of configuration.

Figure 28:
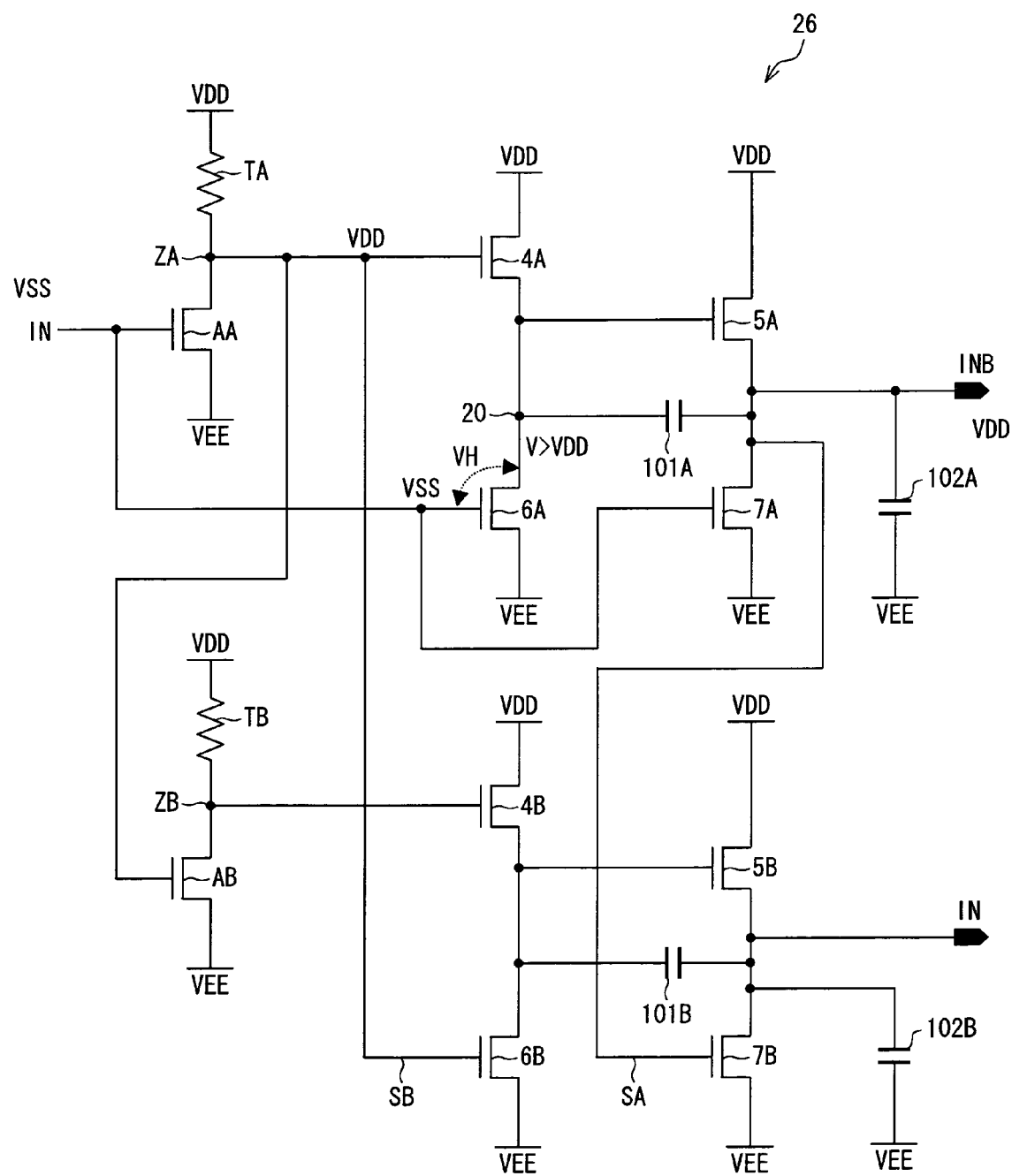
FIG. 28 is a circuit diagram showing how the sixth buffer operates.

As shown in FIG. 28, in a case where the input terminal IN of the buffer 26 shown in FIG. 16 receives a signal having a Low voltage VSS lower than VEE, a transistor 6A has a gate receiving VSS. In this case, a capacitor 101 serving as a bootstrap capacitor causes an electric potential at a point 20, at which the capacitor 101 and a gate of a transistor 5A are connected to each other, to be instantaneously increased to be higher than VDD. Accordingly, a voltage difference VH between the gate and a drain of the transistor 6A is caused to be very large, in some cases, larger than a withstand voltage of the transistor 6A.

Figure 29:
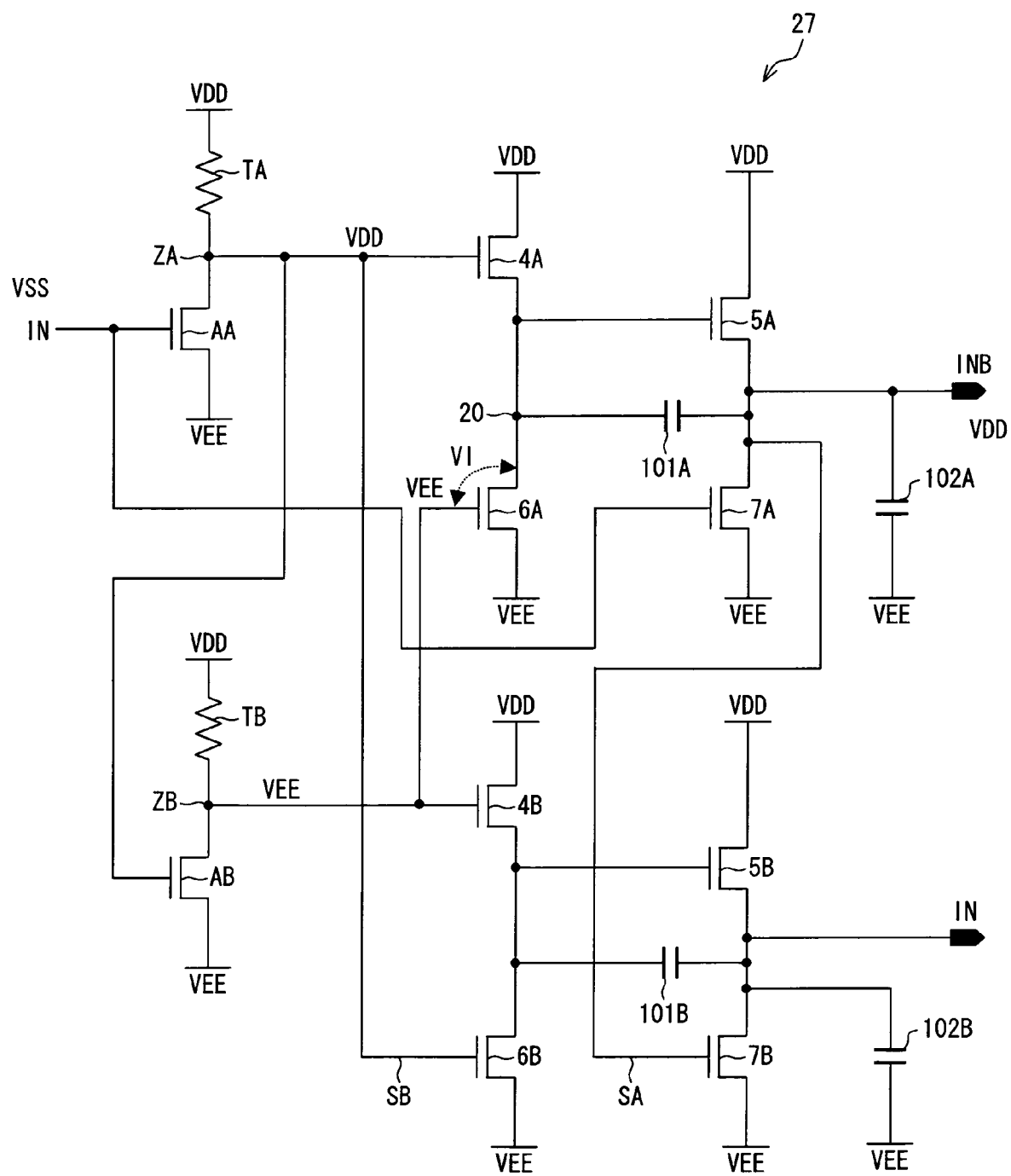
FIG. 29 is a circuit diagram showing a configuration of a seventh buffer in accordance with the embodiment of the present invention.

In a case where the voltage difference VH causes a problem, a buffer 27 shown in FIG. 29 should be employed. The buffer 27 differs from the buffer 26 in that a transistor 6A has a gate connected not to an input terminal IN but a connection point ZB at which a resistor TB and a transistor AB are connected to each other. According to the buffer 27 configured in the way, a transistor AA is turned OFF in a case where the input terminal IN receives VSS. This causes an electric potential at a connection point ZA, at which a resistor TA and the transistor AA are connected to each other, to be VDD. Thus, a transistor AB is turned ON so that an electric potential at the connection point ZB is caused to be VEE. Since VEE is greater in voltage than VSS, a voltage difference VI between the gate and a drain of the transistor 6A is smaller as compared to the voltage difference VH. Thus, it is possible to avoid a problem in that the voltage difference VI is increased beyond a withstand voltage of the transistor 6A.

In a case where the voltage difference VH in the buffer 26 shown in FIG. 16 causes a problem, a buffer 28 shown in FIG. 30 can alternatively be employed. The buffer 28 differs from the buffer 26 in that the buffer 28 includes a transistor 8A connected between a drain of a transistor 6A and a point in cascade. The transistor 8A has the same channel polarity as other transistors in the buffer 28. The transistor 8A has a gate connected to VDD.

According to the buffer 28, in a case where an input terminal IN receives VSS, an electric potential at the point 20 is higher than VDD, while an electric potential at the drain of the transistor 6A is lower than VDD. In this case, a voltage difference VJ between a gate and the drain of the transistor 6A is smaller than "VDD−VSS". Thus, it possible to avoid a problem in that the voltage difference VJ is greater than a withstand voltage of the transistor 6A.

The present invention is not limited to the description of the embodiment above, but may be altered by a skilled person within the scope of the claims. An embodiment based on a proper combination of technical means altered as appropriate within the scope of the claims is encompassed in the technical scope of the present invention. For example, the present invention can be applied in an EL display device.

As described so far, a buffer according to the present invention is a buffer for providing an impedance transformation for an input signal so as to output an output signal, the buffer including: a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points; and an inverted-signal generating section for generating an inverted signal, the inverted-signal generating section including an n-channel transistor but no p-channel transistor, and generating the inverted signal, a polarity of which inverted signal is opposite to the input signal and a signal level of which inverted signal is a predetermined signal level, the input signal being inputted to a gate of that one of the two n-channel transistors forming the first series circuit which is provided closer to the Low voltage source, and that one of the two n-channel transistors forming the second series circuit which is provided closer to the Low voltage source, the inverted signal being inputted to a gate of the other of the two n-channel transistors forming the first series circuit which is provided closer to the High voltage source, and the output signal being outputted via the connection point at which the two n-channel transistors forming the second series circuit are connected to each other in series.

As described so far, a buffer according to the present invention is a buffer for providing an impedance transformation for an input signal so as to output an output signal, the buffer including: a buffer section, including (i) a first series circuit between a High voltage source and a Low voltage source, which first series circuit is formed by two p-channel transistors connected to each other in series at a connection point, (ii) a second series circuit between the High voltage source and the Low voltage source, which second series circuit is formed by two p-channel transistors connected to each other in series at a connection point, and (iii) a first capacitor between the connection points; and an inverted-signal generating section for generating an inverted signal, the inverted-signal generating section including a p-channel transistor but no n-channel transistor, and generating the inverted signal, a polarity of which inverted signal is opposite to the input signal and a signal level of which inverted signal is a predetermined signal level, the input signal being inputted to a gate of that one of the two p-channel transistors forming the first series circuit which is provided closer to the High voltage source, and that one of the two p-channel transistors forming the second series circuit which is provided closer to the High voltage source, the inverted signal being inputted to a gate of the other of the two p-channel transistors forming the first series circuit which is provided closer to the Low voltage source, and the output signal being outputted via the connection point at which the two p-channel transistors forming the second series circuit are connected to each other in series.

Therefore, the present invention can realize a single-phase input buffer including transistors all of which have only a single type of channel polarity, with which single-phase input buffer it is possible that a consumption current can be reduced and a current drive for driving a load can be enhanced.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention can be particularly suitably used in a liquid crystal display device.

The invention claimed is:

1. A buffer for providing an impedance transformation for an input signal so as to output an output signal, the buffer comprising:
a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points; and
an inverted-signal generating section for generating an inverted signal, the inverted-signal generating section including an n-channel transistor but no p-channel transistor, a fourth transistor and a resistor, and generating the inverted signal, a polarity of which inverted signal is opposite to the input signal and a signal level of which inverted signal is a predetermined signal level,
the input signal being inputted to a gate of that one of the two n-channel transistors forming the first series circuit which is provided closer to the Low voltage source, and that one of the two n-channel transistors forming the second series circuit which is provided closer to the Low voltage source,
the inverted signal being inputted to a gate of the other of the two n-channel transistors forming the first series circuit which is provided closer to the High voltage source,
the output signal being outputted via the connection point at which the two n-channel transistors forming the second series circuit are connected to each other in series,
the fourth transistor having a gate for receiving the input signal,
the fourth transistor and the resistor connected to each other in series,
a source of the fourth transistor connected to either one of a High voltage source and a Low voltage source of the inverted-signal generating section, and that end of the resistor, to which no fourth transistor is connected, connected to the other of the High voltage source and the Low voltage source of the inverted-signal generating section, and
the inverted signal being outputted via the connection point at which the fourth transistor and the resistor are connected to each other in series.

2. The buffer as set forth in claim 1, wherein the inverted-signal generating section comprises a first transistor, a second transistor, a third transistor, and a second capacitor,
the third transistor having a gate for receiving the input signal,
the second transistor being connected to the third transistor in series at a connection point,
the first transistor having a gate and a drain connected to each other and a source connected to a gate of the second transistor, the second capacitor connected between the source of the first transistor and the connection point at which the second transistor and the third transistor are connected to each other in series, the drain of the first transistor and that of the second transistor each connected to either one of a High voltage source and a Low voltage source of the inverted-signal generating section, and a source of the third transistor connected to the other of the High voltage source and the Low voltage source of the inverted-signal generating section, and the inverted signal being outputted via the connection point at which the second transistor and the third transistor are connected to each other in series.

3. The buffer as set forth in claim 1, wherein the inverted-signal generating section comprises a first transistor, a second transistor group, a third transistor, and a second capacitor, the third transistor having a gate for receiving the input signal, the second transistor group (A) formed of a plurality of transistors connected to one another in cascade, and (B) connected to the third transistor in series at a connection point, the first transistor having a gate and a drain connected to one each other and a source connected to respective gates of the plurality of transistors forming the second transistor group, the second capacitor connected between the source of the first transistor and the connection point at which the second transistor group and the third transistor are connected to each other in series, and the drain of the first transistor and a drain end of the second transistor group each connected to either one of a High voltage source and a Low voltage source of the inverted-signal generating section, and a source of the third transistor connected to the other of the High voltage source and the Low voltage source of the inverted-signal generating section, and the inverted signal being outputted via the connection point at which the second transistor group and the third transistor are connected to each other in series.

4. A buffer, comprising a first buffer and a second buffer, wherein:

the first buffer is a buffer as set forth in claim 1; and the second buffer has at least a configuration in which the output signal of the first buffer, instead of the input signal, is inputted to a gate of that one of the two channel transistors forming the second series circuit which is provided closer to the low voltage source in the second buffer.

5. A display device, comprising a buffer as set forth in claim 1.

6. The display device as set forth in claim 5, wherein an output circuit of a source driver comprises the buffer.

7. The display device as set forth in claim 5, wherein an output circuit of a gate driver comprises the buffer.

8. The display device as set forth in claim 5, wherein an inverter comprises the buffer, the inverter included in a circuit for generating a signal to be inputted to a source driver and a signal to be inputted to a gate driver.

9. The display device as set forth in claim 5, wherein a level shifter circuit comprises the buffer, the level shifter circuit included in a circuit for generating a signal to be inputted to a source driver and a signal to be inputted to a gate driver.

10. A buffer for providing an impedance transformation for an input signal so as to output an output signal, the buffer comprising:

a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points; and an inverted-signal generating section for generating an inverted signal, the inverted-signal generating section including an n-channel transistor but no p-channel transistor, a fourth transistor and a fifth transistor having a gate and a drain connected to each other, and generating the inverted signal, a polarity of which inverted signal is opposite to the input signal and a signal level of which inverted signal is a predetermined signal level, the input signal being inputted to a gate of that one of the two n-channel transistors forming the first series circuit which is provided closer to the Low voltage source, and that one of the two n-channel transistors forming the second series circuit which is provided closer to the Low voltage source, the inverted signal being inputted to a gate of the other of the two n-channel transistors forming the first series circuit which is provided closer to the High voltage source, the output signal being outputted via the connection point at which the two n-channel transistors forming the second series circuit are connected to each other in series, the fourth transistor having a gate for receiving the input signal, the fourth transistor and the fifth transistor connected to each other in series, a source of the fourth transistor connected to either one of a High voltage source and a Low voltage source of the inverted-signal generating section, and a drain of the fifth transistor connected to the other of the High voltage source and the Low voltage source of the inverted-signal generating section, and the inverted signal being outputted via the connection point at which the fourth transistor and the fifth transistor are connected to each other in series.

11. A buffer for providing an impedance transformation for an input signal so as to output an output signal, the buffer comprising:

a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points, an input-signal level translating section for generating a level translated signal, the input-signal level translated section including an n-channel transistor but no p-channel transistor, a fourth transistor and a resistor, and performing a level translation on the input signal so as to generate the level translated signal, and an inverted-signal generating section for generating an inverted signal, the inverted-signal generating section including an n-channel transistor but no p-channel transistor, and generating the inverted signal on a reception of the level translated signal, a polarity of which inverted signal is opposite to the input signal and a signal level of which inverted signal is a predetermined signal level, the level translated signal being inputted to a gate of that one of the two n-channel transistors forming the first series circuit which is provided closer to the Low voltage source, and a gate of that one of the two n-channel transistors forming the second series circuit which is provided closer to the Low voltage source, the inverted signal being inputted to a gate of the other of the two n-channel transistors forming the first series circuit which is provided closer to the High voltage source, the output signal being outputted via the connection point at which the two n-channel transistors forming the second series circuit are connect to each other in series, the fourth transistor and the resistor connected to each other in series at a connection point, a source of the fourth transistor connected to either one of a High voltage source and a Low voltage source of the inverted-signal generating section, and that end of the resistor, to which no fourth transistor is connected, connected to the other of the High voltage source and the Low voltage source of the inverted-signal generating section, the level translated signal being inputted to the gate of the fourth transistor, and the inverted signal being outputted via the connection point at which the fourth transistor and the resistor are connected each other in series.

12. The buffer as set forth in claim 11, wherein the inverted-signal generating section comprises a first transistor, a second transistor, a third transistor, and a second capacitor, the second transistor and the third transistor connected to each other in series at a connection point, the first transistor having a gate and a drain connected to each other and a source connected to a gate of the second transistor, the second capacitor connected between the source of the first transistor and the connection point at which the third transistor and the second transistor are connected to each other in series, the drain of the first transistor and that of the second transistor each connected to either one of a High voltage source and a Low voltage source of the inverted-signal generating section, and a source of the third transistor connected to the other of the High voltage source and the Low voltage source of the inverted-signal generating section, the third transistor having a gate for receiving the level translated signal, and the inverted signal being outputted via the connection point at which the second transistor and the third transistor are connected to each other in series.

13. The buffer as set forth in claim 11, wherein the inverted-signal generating section comprises a first transistor, a second transistor group, a third transistor, and a second capacitor, the second transistor group (A) formed by a plurality of transistors connected to one another in cascade, and (B) connected to the third transistor in series at a connection point, the first transistor having a gate and a drain connected to each other and a source connected to respective gates of the plurality of transistors forming the second transistor group, the second capacitor connected between the source of the first transistor and the connection point at which the second transistor group and the third transistor are connected to each other in series, the drain of the first transistor and a drain end of the second transistor group each connected to either one of a High voltage source and a Low voltage source of the inverted-signal generating section, and a source of the third transistor connected to the other of the High voltage source and the Low voltage source of the inverted-signal generating section, the level translated signal being inputted to the gate of the third transistor, and the inverted signal being outputted via the connection point at which the second transistor group and the third transistor are connected each other in series.

14. A buffer for providing an impedance transformation for an input signal so as to output an output signal, the buffer comprising:

a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points, an input-signal level translating section for generating a level translated signal, the input-signal level translated section including an n-channel transistor but no p-channel transistor, a fourth transistor and a fifth transistor that has a gate and a drain connected to each other, and performing a level translation on the input signal so as to generate the level translated signal, and an inverted-signal generating section for generating an inverted signal, the inverted-signal generating section including an n-channel transistor but no p-channel transistor, and generating the inverted signal on a reception of the level translated signal, a polarity of which inverted signal is opposite to the input signal and a signal level of which inverted signal is a predetermined signal level, the level translated signal being inputted to a gate of that one of the two n-channel transistors forming the first series circuit which is provided closer to the Low voltage source, and a gate of that one of the two n-channel transistors forming the second series circuit which is provided closer to the Low voltage source, the inverted signal being inputted to a gate of the other of the two n-channel transistors forming the first series circuit which is provided closer to the High voltage source, the output signal being outputted via the connection point at which the two n-channel transistors forming the second series circuit are connect to each other in series, the fourth transistor and the fifth transistor connected to each other in series at a connection point, a source of the fourth transistor connected to either one of a High voltage source and a Low voltage source of the inverted-signal generating section, and the drain of the fifth transistor connected to the other of the High voltage source and the Low voltage source of the inverted-signal generating section, the inverted signal being inputted to the gate of the fourth transistor, and the inverted signal being outputted via the connection point at which the fourth transistor and the fifth transistor are connected to each other in series.

15. A buffer for providing an impedance transformation for an input signal so as to output an output signal, the buffer comprising:

a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, and (iii) a first capacitor between the connection points, an input-signal level translating section for generating a level translated signal, the input-signal level translated section including an n-channel transistor but no p-channel transistor, (x) a first level-translating-section transistor, a second level-translating-section transistor, a third level-translating-section transistor, and a fourth level-translating-section transistor each formed by the channel transistor, and (y) a first level-translating-section capacitor and a second level-translating-section capacitor each formed by a capacitor, and performing a level translation on the input signal so as to generate the level translated signal, and an inverted-signal generating section for generating an inverted signal, the inverted-signal generating section including an n-channel transistor but no p-channel transistor, and generating the inverted signal on a reception of the level translated signal, a polarity of which inverted signal is opposite to the input signal and a signal level of which inverted signal is a predetermined signal level, the level translated signal being inputted to a gate of that one of the two n-channel transistors forming the first series circuit which is provided closer to the Low voltage source, and a gate of that one of the two n-channel transistors forming the second series circuit which is provided closer to the Low voltage source, the inverted signal being inputted to a gate of the other of the two n-channel transistors forming the first series circuit which is provided closer to the High voltage source, the output signal being outputted via the connection point at which the two n-channel transistors forming the second series circuit are connect to each other in series, the second level-translating-section transistor and the third level-translating-section transistor connected to each other in series at a connection point, the first level-translating-section transistor having a gate and a drain connected to each other and a source connected to a gate of the second level-translating-section transistor, the first level-translating-section capacitor connected between the source of the first level-translating-section transistor and the connection point at which the second level-translating-section transistor and the third level-translating-section transistor are connected to each other in series, the second level-translating-section capacitor having one end connected to the connection point at which the second level-translating-section transistor and the third level-translating-section transistor are connected to each other in series, the fourth level-translating-section transistor having a drain and a gate each connected to the other end of the second level-translating-section capacitor, the fifth level-translating-section transistor having a drain connected to the other end of the second level-translating-section capacitor, the drain of the first level-translating-section transistor and that of the second level-translating-section transistor each connected to either one of a High voltage source and a Low voltage source of the inverted-signal generating section, respective sources of the third level-translating-section transistor, the fourth level-translating-section transistor, and the fifth level-translating-section transistors each connected to the other of the High and the Low voltage source of the inverted-signal generating section, the input signal being inputted to the gate of the third level-translating-section transistor, a switching signal for switching a state of the fifth level-translating-section transistor between ON and OFF being able to be inputted to the gate of the fifth level-translating-section transistor, and the level translated signal being outputted via the other end of the second level-translating-section capacitor.

16. A buffer for providing an impedance transformation for an input signal so as to output an output signal, the buffer comprising:

a buffer section, including (i) a first series circuit between a High voltage source and a Low voltage source, which first series circuit is formed by two n-channel transistors connected to each other in series at a connection point, (ii) a second series circuit between the High voltage source and the Low voltage source, which second series circuit is formed by two n-channel transistors connected to each other in series at a connection point, (iii) a first capacitor between the connection points, and (iv) a third capacitor, which is connected to the connection point at which the two transistors forming the second series circuit are connected to each other; and an inverted-signal generating section for generating an inverted signal, the inverted-signal generating section including an n-channel transistor but no p-channel transistor, and generating the inverted signal, a polarity of which inverted signal is opposite to the input signal and a signal level of which inverted signal is a predetermined signal level, the input signal being inputted to a gate of that one of the two n-channel transistors forming the first series circuit which is provided closer to the Low voltage source, and that one of the two n-channel transistors forming the second series circuit which is provided closer to the Low voltage source, the inverted signal being inputted to a gate of the other of the two n-channel transistors forming the first series circuit which is provided closer to the High voltage source, and the output signal being outputted via the connection point at which the two n-channel transistors forming the second series circuit are connected to each other in series.

* * * * *